US012787395B2

(12) United States Patent
Seol et al.

(10) Patent No.: US 12,787,395 B2
(45) Date of Patent: Nov. 3, 2026

(54) SEMICONDUCTOR DEVICE INCLUDING TWO-DIMENSIONAL MATERIAL AND METHOD OF FABRICATING THE SAME

(71) Applicant: Samsung Electronics Co., Ltd., Suwon-si (KR)

(72) Inventors: Minsu Seol, Suwon-si (KR); Junyoung Kwon, Suwon-si (KR); Jitak Nam, Suwon-si (KR); Minseok Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 538 days.

(21) Appl. No.: 18/321,275

(22) Filed: May 22, 2023

(65) Prior Publication Data

US 2024/0030294 A1 Jan. 25, 2024

(30) Foreign Application Priority Data

Jul. 21, 2022 (KR) ........................ 10-2022-0090616

(51) Int. Cl.

*H10D 62/84* (2025.01)
*H10D 62/80* (2025.01)

(Continued)

(52) U.S. Cl.

CPC ........... *H10D 62/84* (2025.01); *H10D 62/882* (2025.01); *H10D 64/251* (2025.01); *H10P 14/3236* (2026.01); *H10P 14/3436* (2026.01)

(58) Field of Classification Search

CPC .... H10D 62/84; H10D 62/882; H10D 64/251; H01L 21/02485; H01L 21/02568; H10P 14/3236; H10P 14/3436

See application file for complete search history.

(56) References Cited

U.S. PATENT DOCUMENTS 7,968,674 B2 6/2011 Choi et al.
7,988,941 B2 8/2011 Choi et al.

(Continued)

FOREIGN PATENT DOCUMENTS

EP 3882212 A1 9/2021
EP 4020586 A1 6/2022

(Continued)

OTHER PUBLICATIONS

Korean Office Action dated Apr. 25, 2025 for corresponding Korean Patent Application No. 10-2022-0090616 and its English-language translation.

(Continued)

*Primary Examiner* — Richard A Booth

(74) *Attorney, Agent, or Firm* — Harness, Dickey & Pierce, P.L.C.

(57) ABSTRACT

A semiconductor device may include at least one first two-dimensional material layer; a source electrode and a drain electrode that are respectively on both sides of the at least one first two-dimensional material layer; second two-dimensional material layers respectively on a side of the source electrode and a side of the drain electrode and connected to the at least one first two-dimensional material layer; a gate insulating layer surrounding the at least one first two-dimensional material layer; and a gate electrode on the gate insulating layer.

20 Claims, 18 Drawing Sheets

(51) Int. Cl.
*H10D 64/23* (2025.01)
*H10P 14/20* (2026.01)

(56) References Cited

U.S. PATENT DOCUMENTS

| | | | |
|---|---|---|---|
| 8,133,466 B2 | 3/2012 | Shin et al. | |
| 8,283,038 B2 | 10/2012 | Choi et al. | |
| 8,535,553 B2 | 9/2013 | Kong et al. | |
| 8,623,761 B2 | 1/2014 | Bonilla et al. | |
| 8,723,024 B2 | 5/2014 | Choi et al. | |
| 8,895,433 B2 | 11/2014 | Bonilla et al. | |
| 8,906,787 B2 | 12/2014 | Park et al. | |
| 8,912,530 B2 | 12/2014 | Yang et al. | |
| 9,040,957 B2 | 5/2015 | Lee et al. | |
| 9,064,777 B2 | 6/2015 | Heo et al. | |
| 9,108,848 B2 | 8/2015 | Woo et al. | |
| 9,324,634 B2 | 4/2016 | Bao et al. | |
| 9,324,635 B2 | 4/2016 | Bao et al. | |
| 9,359,211 B2 | 6/2016 | Woo et al. | |
| 9,472,450 B2 | 10/2016 | Bonilla et al. | |
| 9,527,043 B2 | 12/2016 | Choi et al. | |
| 9,533,265 B2 | 1/2017 | Choi et al. | |
| 9,583,358 B2 | 2/2017 | Kim et al. | |
| 9,721,734 B2 | 8/2017 | Ryu et al. | |
| 10,325,987 B2 | 6/2019 | Park et al. | |
| 10,388,732 B1 * | 8/2019 | Frougier | H10D 30/6744 |
| 10,741,646 B2 | 8/2020 | Yeh et al. | |
| 11,239,342 B2 | 2/2022 | Cheng et al. | |
| 2006/0091481 A1 | 5/2006 | Li et al. | |
| 2011/0127471 A1 | 6/2011 | Shin et al. | |
| 2013/0059155 A1 | 3/2013 | Choi et al. | |
| 2014/0087191 A1 | 3/2014 | Chua et al. | |
| 2015/0235959 A1 | 8/2015 | Lee et al. | |
| 2016/0141427 A1 | 5/2016 | Chen et al. | |
| 2016/0190244 A1 | 6/2016 | Lee et al. | |
| 2018/0308986 A1 | 10/2018 | Chao et al. | |
| 2020/0350252 A1 | 11/2020 | Shin et al. | |
| 2021/0296445 A1 | 9/2021 | Lee et al. | |
| 2021/0305378 A1 | 9/2021 | Seol et al. | |
| 2022/0077321 A1 * | 3/2022 | Seol | H10D 30/47 |
| 2023/0077783 A1 | 3/2023 | Lee et al. | |

FOREIGN PATENT DOCUMENTS

| | | | |
|---|---|---|---|
| EP | 4148802 | A1 | 3/2023 |
| KR | 10-2006-0037561 | A1 | 5/2006 |
| KR | 10-1559292 | B1 | 10/2015 |
| KR | 10-2016-0081102 | A | 7/2016 |
| KR | 10-2016-0124958 | A | 10/2016 |
| KR | 10-2018-0074857 | A | 7/2018 |
| KR | 10-2020-0126925 | A | 11/2020 |
| KR | 10-2021-0117004 | A | 9/2021 |
| KR | 10-2021-0121948 | A | 10/2021 |
| KR | 10-2022-0031366 | A | 3/2022 |
| WO | WO-2018/009931 | A1 | 1/2018 |

OTHER PUBLICATIONS

Extended European Search Report dated Dec. 21, 2023 for corresponding European Patent Application No. 23185774.9.

Korean Office Action dated Jan. 19, 2024 for corresponding Korean Patent Application No. 10-2022-0090616 and its English-language translation.

* cited by examiner

SEMICONDUCTOR DEVICE INCLUDING TWO-DIMENSIONAL MATERIAL AND METHOD OF FABRICATING THE SAME

CROSS-REFERENCE TO RELATED APPLICATION

This application is based on and claims priority under 35 U.S.C. § 119 to Korean Patent Application No. 10-2022-0090616, filed on Jul. 21, 2022 in the Korean Intellectual Property Office, the disclosure of which is incorporated by reference herein in its entirety.

BACKGROUND

1. Field

The present disclosure relates to semiconductor devices including a two-dimensional material and methods of fabricating the semiconductor devices.

2. Description of the Related Art

Transistors are semiconductor devices having an electrical switching function and are used in various semiconductor products such as memories and driving integrated circuits (ICs). A decrease in the size of semiconductor devices may have an effect of increasing the number of semiconductor devices integrated on one wafer and increasing the driving speed of semiconductor devices. Thus, much research has been conducted to reduce the size of semiconductor devices.

Recently, methods of reducing the size of semiconductor devices by using two-dimensional materials have been researched. Two-dimensional materials have stable and good characteristics even when having a small thickness within the range of about 1 nm or less, and thus there is interest in two-dimensional materials for addressing a decrease in the performance of semiconductor devices caused by a decrease in the size of semiconductor devices.

SUMMARY

Provided are semiconductor devices including a two-dimensional material and methods of fabricating the semiconductor devices.

Additional aspects will be set forth in part in the description which follows and, in part, will be apparent from the description, or may be learned by practice of the presented embodiments of the disclosure.

According to an embodiment, a semiconductor device may include at least one first two-dimensional material layer; a source electrode and a drain electrode that are respectively on both sides of the at least one first two-dimensional material layer; second two-dimensional material layers respectively on a side of the source electrode and a side of the drain electrode and connected to the at least one first two-dimensional material layer; a gate insulating layer surrounding the at least one first two-dimensional material layer; and a gate electrode on the gate insulating layer.

In some embodiments, the second two-dimensional material layers may extend in a direction substantially perpendicular to the at least one first two-dimensional material layer.

In some embodiments, the second two-dimensional material layers may be in planar contact with the source electrode and the drain electrode.

In some embodiments, the at least one first two-dimensional material layer may include a plurality of first two-dimensional material layers. The plurality of first two-dimensional material layers may extend in a direction substantially perpendicular to the second two-dimensional material layers, and the plurality of first two-dimensional material layers may be spaced apart from each other. All or some of the plurality of first two-dimensional material layers may be connected to the second two-dimensional material layers.

In some embodiments, the at least one first two-dimensional material layer may include a two-dimensional material having semiconductor characteristics. The at least one first two-dimensional material layer may include a material having a bandgap of about 0.1 eV to about 3.0 eV.

In some embodiments, the at least one first two-dimensional material layer may include a transition metal dichalcogenide (TMD) or black phosphorus. The TMD may include at least one of Mo, W, Nb, V, Ta, Ti, Zr, Hf, Co, Tc, and Re. The chalcogen element may include at least one of S, Se, and Te.

In some embodiments, the second two-dimensional material layers may include a two-dimensional material having semiconductor characteristics, metallic characteristics, or semi-metallic characteristics. The second two-dimensional material layers may include a TMD, black phosphorus, or graphene.

In some embodiments, the at least one first two-dimensional material layer and the second two-dimensional material layers may each independently include one to ten layers. The at least one first two-dimensional material layer and the second two-dimensional material layers may each independently include one to five layers.

In some embodiments, a number of the second two-dimensional material layers may be greater than or equal to a number of at least one first two-dimensional material layer.

In some embodiments, the at least one first two-dimensional material layer, the second two-dimensional material layers, or both the at least one first two-dimensional material layer and the second two-dimensional material layers may include a dopant.

According to an embodiment, an electronic apparatus may include the semiconductor device.

According to an embodiment, a method of fabricating a semiconductor device may include alternately stacking at least one sacrificial layer and at least one first two-dimensional material layer on a substrate; etching a first side and a second side of the at least one first two-dimensional material layer and the at least one sacrificial layer in a first direction to provide a first etched side and a second etched side of the at least one first two-dimensional material layer and the at least one first sacrificial layer; forming second two-dimensional material layers respectively on both the first etched side and the second etched side of the at least one first two-dimensional material layer and the at least one first sacrificial layer; forming a source electrode and a drain electrode respectively on the first etched side and the second etched side of the at least one first two-dimensional material layer and the at least one first sacrificial layer such that the source electrode and the drain electrode are in contact with the second two-dimensional material layers; removing the at least one sacrificial layer and then forming a gate insulating layer that surrounds the at least one first two-dimensional material layer; and forming a gate electrode on the gate insulating layer.

In some embodiments, the method may further include etching, in a second direction perpendicular to the first direction, a third side and a fourth side of the at least one first two-dimensional material layer and the at least one sacrificial layer after the etching the first side and the second side of the at least one first two-dimensional material layer and the at least one first sacrificial layer in the first direction is performed.

In some embodiments, the forming the second two-dimensional material layers may include growing the second two-dimensional material layers on edge portions of the at least one first two-dimensional material layer in a direction substantially perpendicular to the at least one first two-dimensional material layer.

In some embodiments, the at least one first two-dimensional material layer may include a plurality of first two-dimensional material layers, and the forming the second two-dimensional material layers may include forming the second two-dimensional material layers connected to all or some of the plurality of first two-dimensional material layers.

In some embodiments, the second two-dimensional material layers may be in planar contact with the source electrode and the drain electrode.

In some embodiments, the at least one first two-dimensional material layer may include a two-dimensional material having semiconductor characteristics. The at least one first two-dimensional material layer may include a material having a bandgap of about 0.1 eV to about 3.0 eV. The at least one first two-dimensional material layer may include a transition metal dichalcogenide (TMD) or black phosphorus.

In some embodiments, the second two-dimensional material layers may include a two-dimensional material having semiconductor characteristics, metallic characteristics, or semi-metallic characteristics. The second two-dimensional material layer may include a TMD, black phosphorus, or graphene.

In some embodiments, the at least one first two-dimensional material layer and the second two-dimensional material layers may each independently include one to ten layers.

In some embodiments, a number of layers in the second two-dimensional material layers may be greater than or equal to a number of layers in the at least one first two-dimensional material layer.

In some embodiments, the at least one first two-dimensional material layer, the second two-dimensional material layer, or both the at least one first two-dimensional material layer and the second two-dimensional material layer may include a dopant.

According to an embodiment, a semiconductor device may include a substrate; a source electrode and a drain electrode spaced apart from each other in a first direction on a surface of the substrate; a channel structure between the source electrode and the drain electrode, the channel structure including a first two-dimensional material layer extending in the first direction between a surface of the source electrode and a surface of the drain electrode; a gate insulating layer surrounding the channel structure; a gate electrode on the gate insulating layer, the gate electrode being spaced apart from the source electrode and the drain electrode; and a plurality of second two-dimensional material layers spaced apart from each other on the substrate. A first pair of the plurality of second two-dimensional material layers respectively may contact opposite sides of the first two-dimensional material layer and respectively extend along the surface of the source electrode and the surface of the drain electrode.

In some embodiments, the first pair of the second two-dimensional material layers may be in planar contact with the source electrode and the drain electrode.

In some embodiments, the first two-dimensional material layer may include a transition metal dichalcogenide (TMD) or black phosphorus, and the plurality of second two-dimensional material layers may include a TMD, black phosphorus, or graphene.

In some embodiments, the channel structure may include a plurality of first two-dimensional material layers spaced apart from each other over the surface of the substrate. The plurality of first two-dimensional material layers may extend in the first direction between the surface of the source electrode and the surface of the drain electrode. The first pair of the plurality of second two-dimensional material layers respectively may contact opposite sides of each of the plurality of first two-dimensional material layers.

In some embodiments, the channel structure may include an additional first two-dimensional material layer spaced apart from the first two-dimensional material layer over the surface of the substrate. The additional first two-dimensional material layer may extend in the first direction between the surface of the source electrode and the surface of the drain electrode. A second pair of the plurality of second two-dimensional material layers respectively may contact opposite sides of the additional first two-dimensional material layer and respectively extend along the surface of the source electrode and the surface of the drain electrode. The first pair of the plurality of second two-dimensional material layers and the second pair of the plurality of second two-dimensional material layers may be spaced apart from each other over the surface of the substrate.

According to an embodiment, an electronic apparatus may include the semiconductor device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
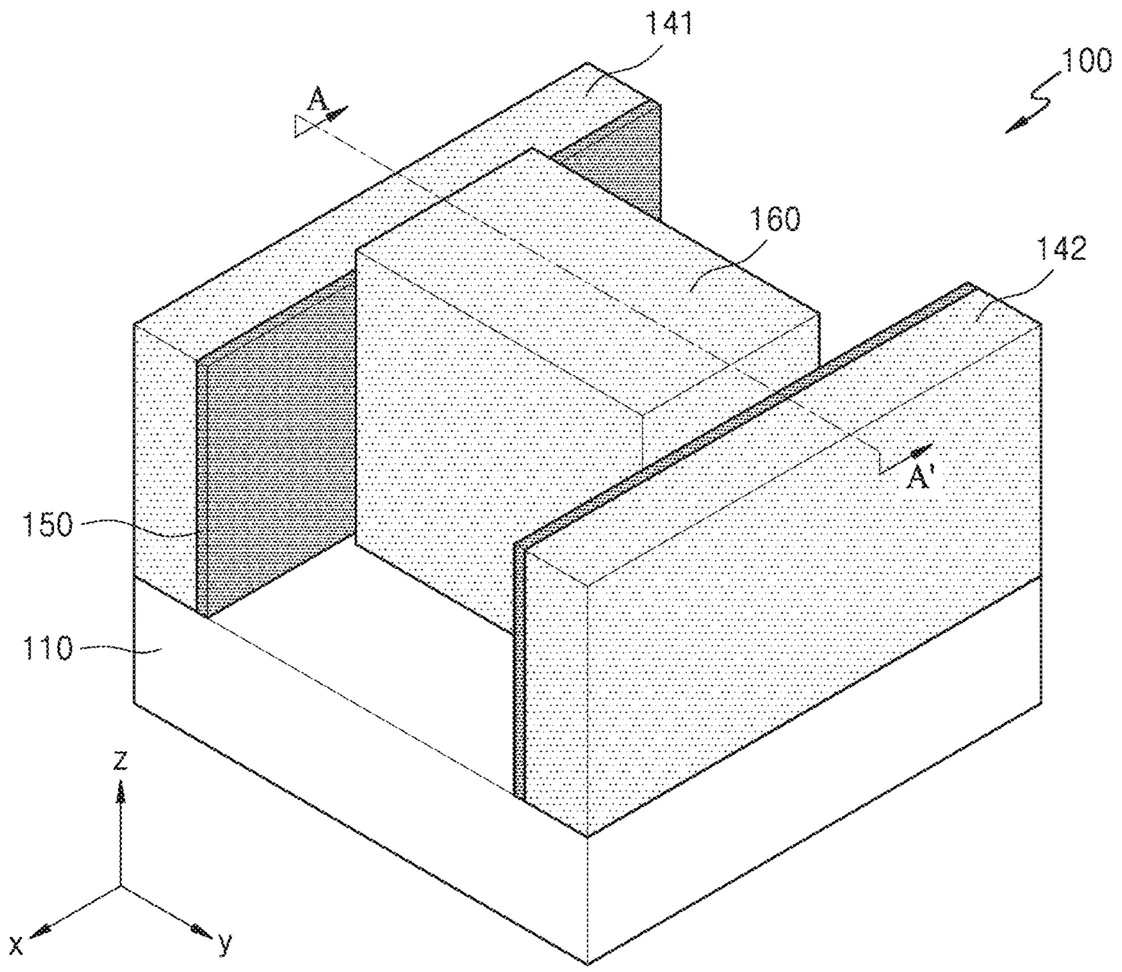
FIG. 1 is a perspective view illustrating a semiconductor device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, example embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative determiner may be construed as the element or the elements even though it has a singular form. Operations of a method may be performed in an appropriate order unless explicitly described in terms of order or described to the contrary, and are not limited to the stated order thereof.

In the present disclosure, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples or example terms are just used herein to describe technical ideas and should not be considered for purposes of limitation unless defined by the claims.

Figure 2:
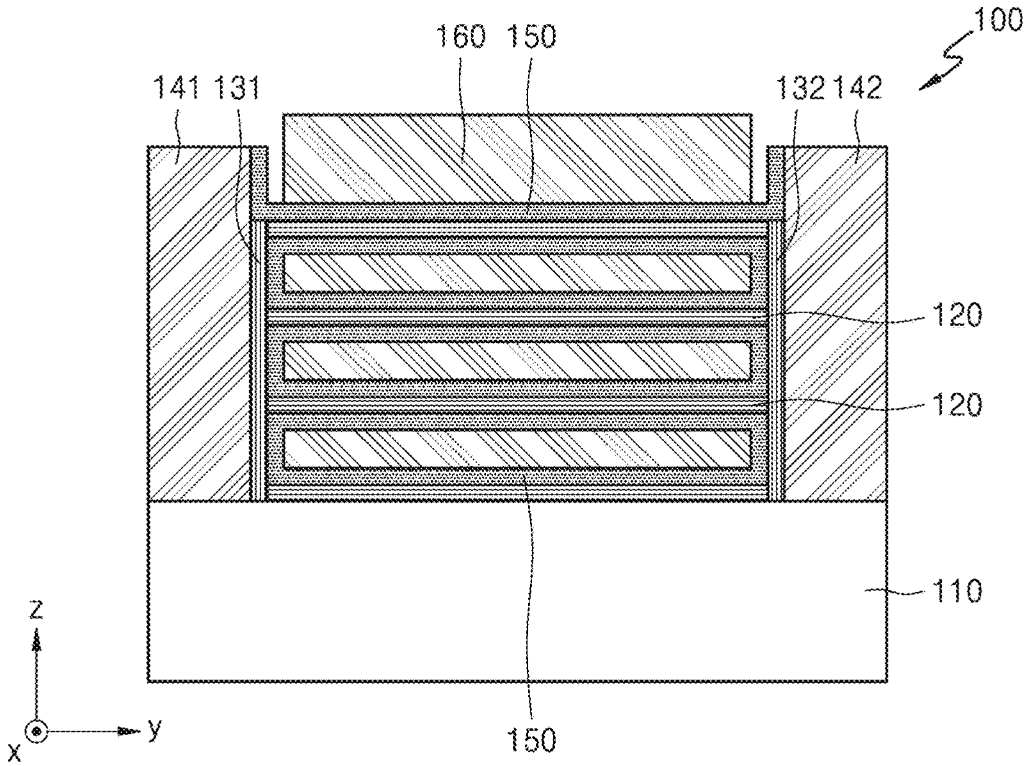
FIG. 2 is a cross-sectional view taken along line A-A' of FIG. 1.

FIG. 1 is a perspective view illustrating a semiconductor device 100 according to an example embodiment. The semiconductor device 100 illustrated in FIG. 1 may be, for example, a multi bridge channel field effect transistor (MBC-FET). FIG. 2 is a cross-sectional view taken along line A-A' of FIG. 1.

Referring to FIGS. 1 and 2, a channel layer is provided on a substrate 110. The substrate 110 may include various materials. For example, the substrate 110 may include a semiconductor (e.g., single crystal silicon) substrate, a compound semiconductor substrate, or a semiconductor-on-insulator (SOI) substrate. However, the listed substrates are merely examples. In addition, the substrate 110 may further include, for example, an impurity region formed by doping, an electronic device such as a transistor, or a peripheral circuit configured to select and control memory cells for storing data.

The channel layer includes one or more first two-dimensional material layers 120 stacked in a direction substantially perpendicular to the substrate 110 (for example, a z-axis direction). Here, each of the first two-dimensional material layers 120 may extend in a direction parallel to the substrate 110. FIGS. 1 and 2 illustrate an example in which four first two-dimensional material layers 120 are stacked at a distance from each other in the direction perpendicular to the substrate 110. Here, the first two-dimensional material layers 120 may form a multi-bridge channel. However, this is merely an example, and in another example, the channel layer may include one first two-dimensional material layer 120. Hereinafter, the case in which the channel layer includes a plurality of first two-dimensional material layers 120 will be described as an example.

The first two-dimensional material layers 120 may include a two-dimensional material having semiconductor characteristics. The two-dimensional material refers to a material having a layered structure in which constituent atoms are two-dimensionally bonded to each other. The two-dimensional material having semiconductor characteristics may have good electrical characteristics, and even when having a nanoscale thickness, the two-dimensional material may maintain high mobility without significant changes in the characteristics thereof.

The first two-dimensional material layers 120 may include a material having a bandgap of about 0.1 eV to about 3.0 eV. For example, the first two-dimensional material layers 120 may include a transition metal dichalcogenide (TMD) or black phosphorus. However, the first two-dimensional material layers 120 are not limited thereto.

The TMD is a two-dimensional material, which has semiconductor characteristics and is a compound of a transition metal and a chalcogen element. Here, the transition metal may include, for example, at least one selected from the group consisting of Mo, W, Nb, V, Ta, Ti, Zr, Hf, Co, Tc, and Re, and the chalcogen element may include, for example, at least one selected from the group consisting of S, Se, and Te. Examples of the TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and the like. However, examples of the TMD are not limited thereto. The black phosphorus is a semiconductor material having a structure in which phosphorus (P) atoms are two-dimensionally bonded to each other.

The first two-dimensional material layers 120 may further include a dopant to control mobility. The first two-dimensional material layers 120 may be doped with a p-type dopant or an n-type dopant. The first two-dimensional material layers 120 may be doped with the p-type dopant or the n-type dopant by an ion implantation method or a chemical doping method.

For example, a source of the p-type dopant may include: an ionic liquid such as $NO_2BF_4$, $NOBF_4$, or $NO_2SbF_6$; an acid compound such as HCl, $H_2PO_4$, $CH_3COOH$, $H_2SO_4$, or $HNO_3$; an organic compound such as dichlorodicyanoquinone (DDQ), oxone, dimyristoylphosphatidylinositol (DMPI), or trifluoromethanesulfoneimide; or the like. Alternatively, the source of the p-type dopant may include $HPtCl_4$, $AuCl_3$, $HAuCl_4$, silver trifluoromethanesulfonate (AgOTf), $AgNO_3$, $H_2PdCl_6$, $Pd(OAc)_2$, $Cu(CN)_2$, or the like.

Examples of a source of the n-type dopant may include: a reduction product of a substituted or unsubstituted nicotinamide; a reduction product of a compound which is chemically bound to a substituted or unsubstituted nicotinamide; and a compound including at least two pyridinium moieties in which a nitrogen atom of at least one of the pyridinium moieties is reduced. For example, the source of the n-type dopant may include nicotinamide mononucleotide-H (NMNH), nicotinamide adenine dinucleotide-H (NADH), nicotinamide adenine dinucleotide phosphate-H (NADPH), or viologen. Alternatively, the source of the n-type dopant may include a polymer such as polyethylenimine (PEI). Alternatively, the n-type dopant may include an alkali metal such as K or Li. The materials listed above as p-type dopant materials or n-type dopant materials are merely examples, and other various materials may be used as dopants.

Each of the first two-dimensional material layers 120 may have a monolayer or multilayer structure in which each layer has an atomic level thickness. Each of the first two-dimensional material layers 120 may include, for example, one to ten layers. For example, each of the first two-dimensional material layers 120 may include one to five layers. However, the first two-dimensional material layers 120 are not limited thereto.

A source electrode 141 and a drain electrode 142 are respectively provided on both sides of the channel layer which includes the first two-dimensional material layers 120. The source electrode 141 and the drain electrode 142 may include, for example, a metal material having high electrical conductivity, such as Ag, Au, Pt, or Cu, but are not limited thereto.

Both ends of the channel layer including the first two-dimensional material layers 120 are electrically connected to a pair of second two-dimensional material layers 131 and 132. Here, each of the second two-dimensional material layers 131 and 132 may extend in a direction substantially perpendicular to the first two-dimensional material layers 120, that is, in the direction (for example, the z-axis direction) substantially perpendicular to the substrate 110. The second two-dimensional material layers 131 and 132 may be respectively provided on one side of the source electrode 141 and one side of the drain electrode 142.

The second two-dimensional material layer 131 provided on one side of the source electrode 141 may be electrically connected to end portions of the first two-dimensional material layers 120. The second two-dimensional material layer 132 provided on one side of the drain electrode 142 may be electrically connected to the other end portions of the first two-dimensional material layers 120. Here, all of the first two-dimensional material layers 120 may be electrically connected to each of the second two-dimensional material layers 131 and 132.

Each of the second two-dimensional material layers 131 and 132 may be in planar contact with the source electrode 141 and the drain electrode 142, and thus the contact resistance between the second two-dimensional material layers 131 and 132 and the source and drain electrodes 141 and 142 may be reduced.

The second two-dimensional material layers 131 and 132 may include a two-dimensional material having semiconductor characteristics, metallic characteristics, or semi-metallic characteristics. For example, the second two-dimensional material layers 131 and 132 may include a TMD or black phosphorus. The TMD may include a material, which has semiconductor characteristics or metallic characteristics depending on the crystal structure thereof. For example, the second two-dimensional material layers 131 and 132 may include a two-dimensional material having semi-metallic characteristics, such as graphene and antimony. For example, the second two-dimensional material layers 131 and 132 may include the same material as that included in the first two-dimensional material layers 120. However, embodiments are not limited thereto, and in another example, the second two-dimensional material layers 131 and 132 may include a material different from a material included in the first two-dimensional material layers 120. The second two-dimensional material layers 131 and 132 may further include a dopant to further reduce contact resistance.

Each of the second two-dimensional material layers 131 and 132 may have a monolayer or multilayer structure in which each layer has an atomic level thickness. Each of the second two-dimensional material layers 131 and 132 may include, for example, one to ten layers. For example, each of the second two-dimensional material layers 131 and 132 may include one to five layers. However, embodiments are not limited thereto. The number of layers included in each of the second two-dimensional material layers 131 and 132 may be equal to or greater than the number of layers included in each of the first two-dimensional material layers 120. The second two-dimensional material layers 131 and 132 may each include a plurality of layers to reduce contact resistance with the source and drain electrodes 141 and 142.

The second two-dimensional material layers 131 and 132 may be grown through edge epitaxy on the end portions of the first two-dimensional material layers 120. As a result, the contact resistance between the first two-dimensional material layers 120 and the second two-dimensional material layers 131 and 132 may be reduced.

A gate insulating layer 150 is provided to surround the first two-dimensional material layers 120 which forms the channel layer, and a gate electrode 160 is provided on the gate insulating layer 150.

The gate insulating layer 150 may include, for example, silicon nitride, but is not limited thereto. The gate electrode 160 may include a metal material or a conductive oxide. Here, the metal material may include, for example, at least one selected from the group consisting of Au, Ti, TiN, TaN, W, Mo, WN, Pt, and Ni. In addition, the conductive oxide may include, for example, indium tin oxide (ITO), indium zinc oxide (IZO), or the like. However, the listed materials are merely examples.

The contact resistance of a planar contact between one surface of a two-dimensional semiconductor material and a metal material may be less than the contact resistance of an edge contact between an edge portion of the two-dimensional semiconductor material and the metal material. In addition, when a two-dimensional material having semi-metallic characteristics forms an edge contact, the contact resistance of the edge contact may increase because of, for example, a metal-induced gap state (MIGS) or a defect-induced gap state (DIGS). However, when the two-dimensional material having semi-metallic characteristics forms a planar contact, the contact resistance of the planar contact may be relatively low because the occurrence of an MIGS or DIGS reduces.

In the semiconductor device 100 of the current embodiment, the second two-dimensional material layers 131 and 132 electrically connected to the at least one first two-dimensional material layer 120 forming the channel layer are in planar contact with the source and drain electrodes 141 and 142, and thus the contact resistance between the second two-dimensional material layers 131 and 132 and the source and drain electrodes 141 and 142 may be reduced. In addition, because the second two-dimensional material layers 131 and 132 have a gating effect, the contact resistance between the second two-dimensional material layers 131 and 132 and the source and drain electrodes 141 and 142 may be further reduced when Schottky contact are formed between the second two-dimensional material layers 131 and 132 and the source and drain electrodes 141 and 142. Because the second two-dimensional material layers 131 and 132 are grown through edge epitaxy on the end portions of the first two-dimensional material layers 120, the contact resistance between the first two-dimensional material layers 120 and the second two-dimensional material layers 131 and 132 may also be reduced.

Figure 3:
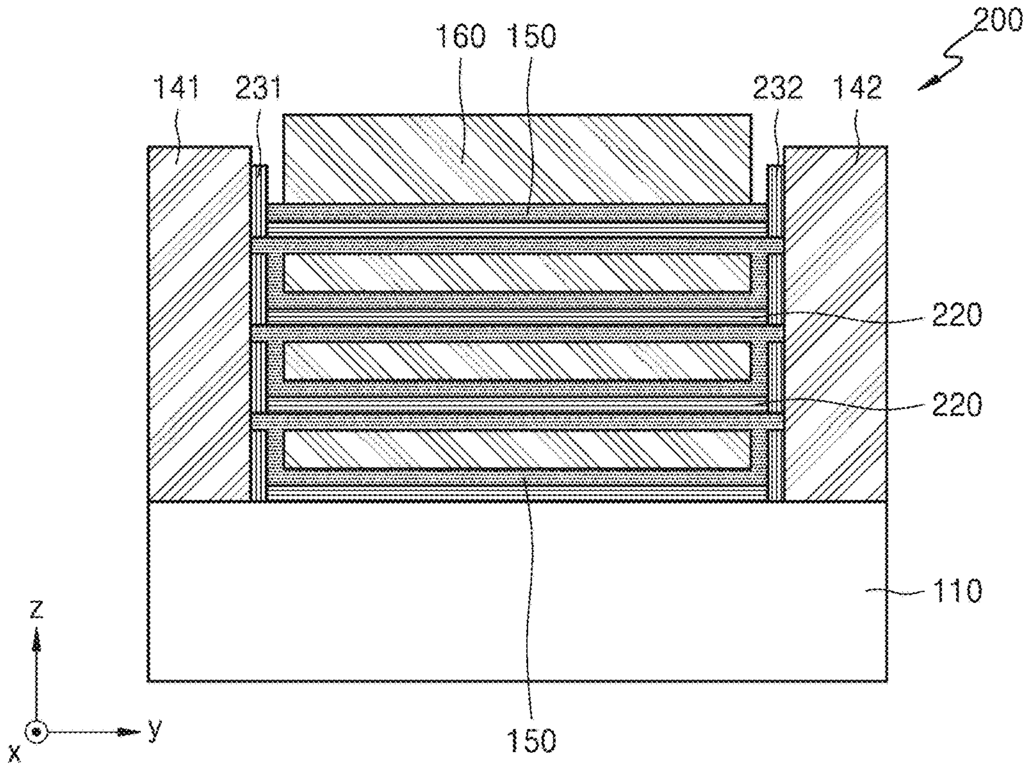
FIG. 3 is a cross-sectional view illustrating a semiconductor device according to another example embodiment.

FIG. 3 is a cross-sectional view illustrating a semiconductor device 200 according to another example embodiment. Hereinafter, differences from the previous embodiment will be mainly described.

Referring to FIG. 3, a channel layer includes a plurality of first two-dimensional material layers 220 stacked in a direction (for example, a z-axis direction) substantially perpendicular to a substrate 110. FIG. 3 illustrates an example in which four first two-dimensional material layers 220 are stacked at a distance from each other in the direction perpendicular to the substrate 110. The descriptions of the first two-dimensional material layers 120 apply to the first two-dimensional material layers 220, and thus the first two-dimensional material layers 220 will not be described in detail here.

Both ends of the channel layer including the first two-dimensional material layers 220 are electrically connected to a pair of second two-dimensional material layers 231 and 232. Here, each of the second two-dimensional material layers 231 and 232 may be provided in a direction substantially perpendicular to the first two-dimensional material layer 220, that is, in the direction (for example, the z-axis direction) substantially perpendicular to the substrate 110. Because the first two-dimensional material layers 220 have been described above, detailed descriptions thereof will not be presented here.

In the current embodiment, each of the second two-dimensional material layers 231 and 232 may include a plurality of material layers, which are apart from each other. The material layers may be grown through edge epitaxy on end portions of the first two-dimensional material layers 220. Here, conditions for growing the material layers may be adjusted such that the material layers may be formed apart from each other instead of being formed in one piece.

Each of the material layers may be electrically connected to a portion of the first two-dimensional material layers 220. FIG. 3 illustrates an example in which one material layer is connected to one first two-dimensional material layer 220. However, embodiments are not limited thereto. In another example, two or three first two-dimensional material layers 220 may be connected to one material layer.

Figure 4A:
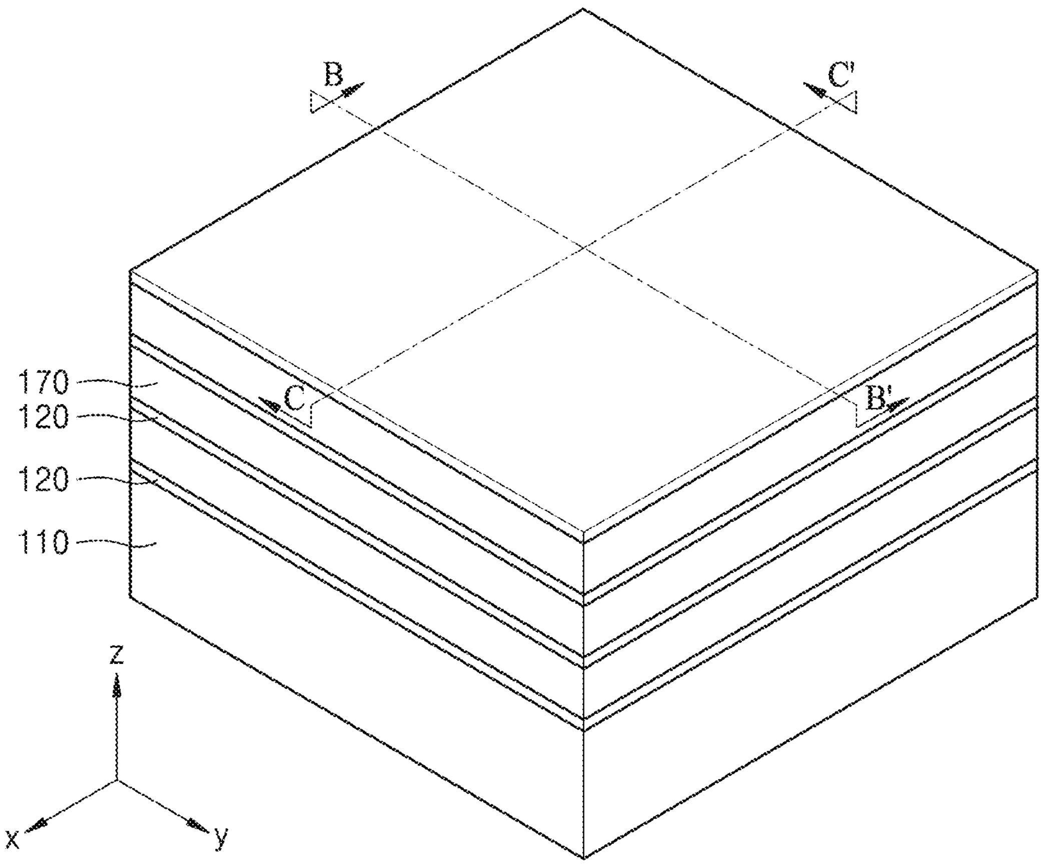
FIGS. 4A to 10C are views illustrating a method of fabricating a semiconductor device according to example embodiments.

FIGS. 4A to 10C are views illustrating a method of fabricating a semiconductor device according to example embodiments. Among FIGS. 4A to 4C, FIG. 4B is a cross-sectional view taken along line B-B' of FIG. 4A, and FIG. 4C is a cross-sectional view taken along line C-C' of FIG. 4A. This applies to the following drawings.

Figure 4B:
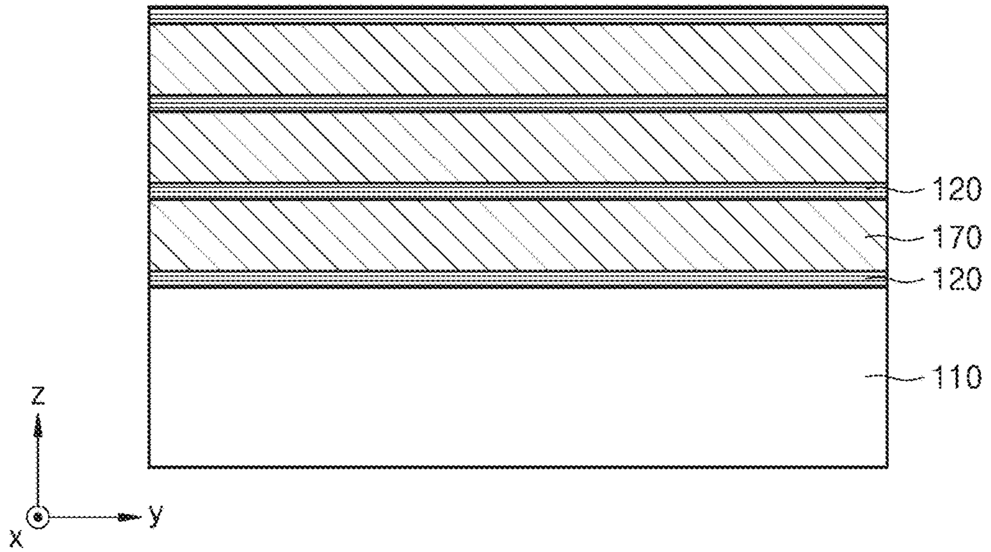
Figure 4C:
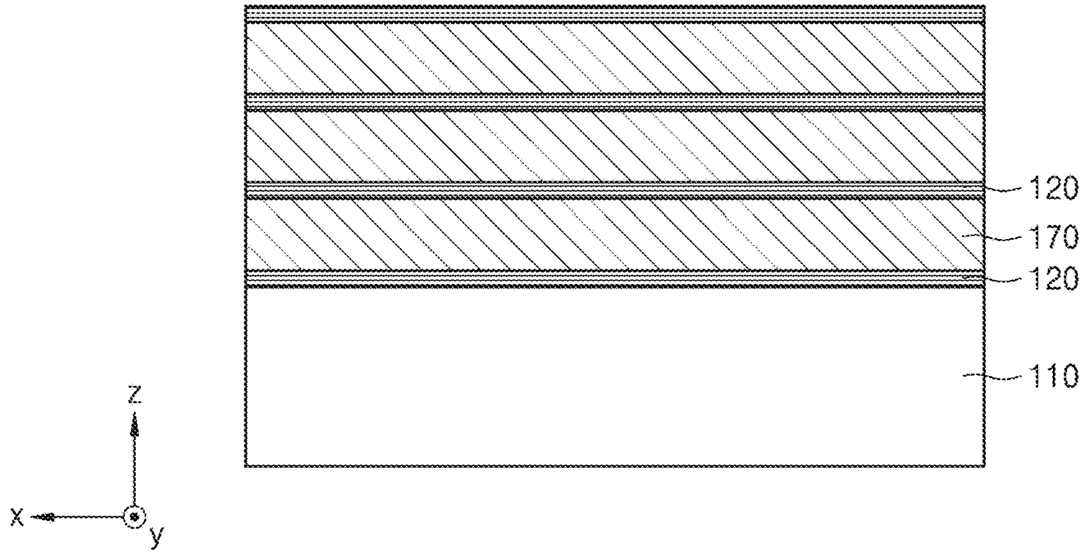

Referring to FIGS. 4A to 4C, a stacked structure is formed by alternately depositing a plurality of first two-dimensional material layers 120 and a plurality of sacrificial layers 170 on an upper surface of a substrate 110. The substrate 110 may include various materials. For example, the substrate 110 may include a single crystal silicon substrate, a compound semiconductor substrate, or an SOI substrate. However, the listed substrates are merely examples. In addition, the substrate 110 may further include, for example, an impurity region formed by doping, an electronic device such as a transistor, or a peripheral circuit configured to select and control memory cells for storing data.

The first two-dimensional material layers 120 and the sacrificial layers 170 may be alternately deposited in a direction substantially perpendicular to the substrate 110 (for example, a z-axis direction). The first two-dimensional material layers 120 and the sacrificial layers 170 may be deposited by, for example, chemical vapor deposition (CVD) or atomic layer deposition (ALD). However, the listed deposition methods are merely examples.

The first two-dimensional material layers 120 include a two-dimensional material having semiconductor characteristics. The first two-dimensional material layers 120 may include a material having a bandgap of about 0.1 eV to about 3.0 eV. For example, the first two-dimensional material layers 120 may include a TMD or black phosphorus. However, the first two-dimensional material layers 120 are not limited thereto.

The TMD is a two-dimensional material, which has semiconductor characteristics and is a compound of a transition metal and a chalcogen element. Here, the transition metal may include, for example, at least one selected from the group consisting of Mo, W, Nb, V, Ta, Ti, Zr, Hf, Co, Tc, and Re, and the chalcogen element may include, for example, at least one selected from the group consisting of S, Se, and Te. Examples of the TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and the like. However, examples of the TMD are not limited thereto. The black phosphorus is a semiconductor material having a structure in which phosphorus (P) atoms are two-dimensionally bonded to each other.

The first two-dimensional material layers 120 may further include a dopant to control mobility. The first two-dimensional material layers 120 may be doped with a p-type dopant or an n-type dopant. The first two-dimensional material layers 120 may be doped with the p-type dopant or the n-type dopant by an ion implantation method or a chemical doping method.

Each of the first two-dimensional material layers 120 may have a monolayer or multilayer structure in which each layer has an atomic level thickness. Each of the first two-dimensional material layers 120 may include, for example, one to ten layers. For example, each of the first two-dimensional material layers 120 may include one to five layers. However, the first two-dimensional material layers 120 are not limited thereto.

The sacrificial layers 170 formed between the first two-dimensional material layers 120 may include a material having etching selectivity with respect to the first two-dimensional material layers 120.

Figure 5A:
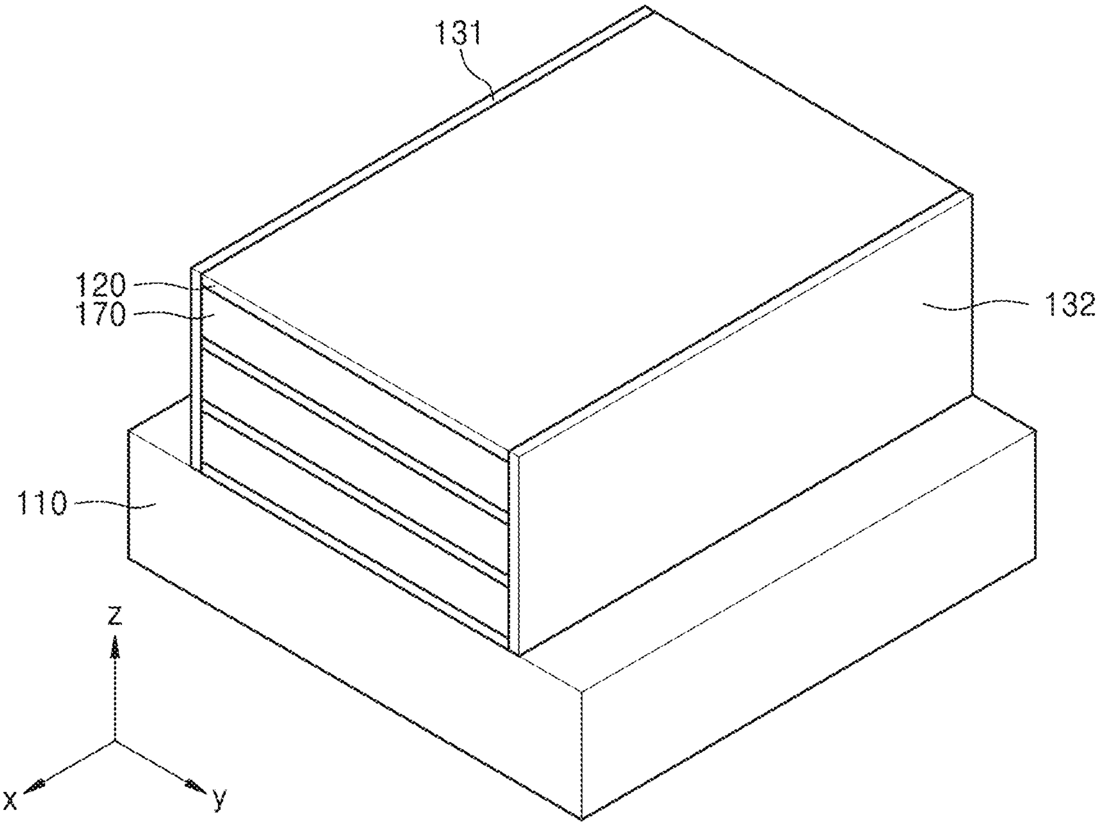
Figure 5B:
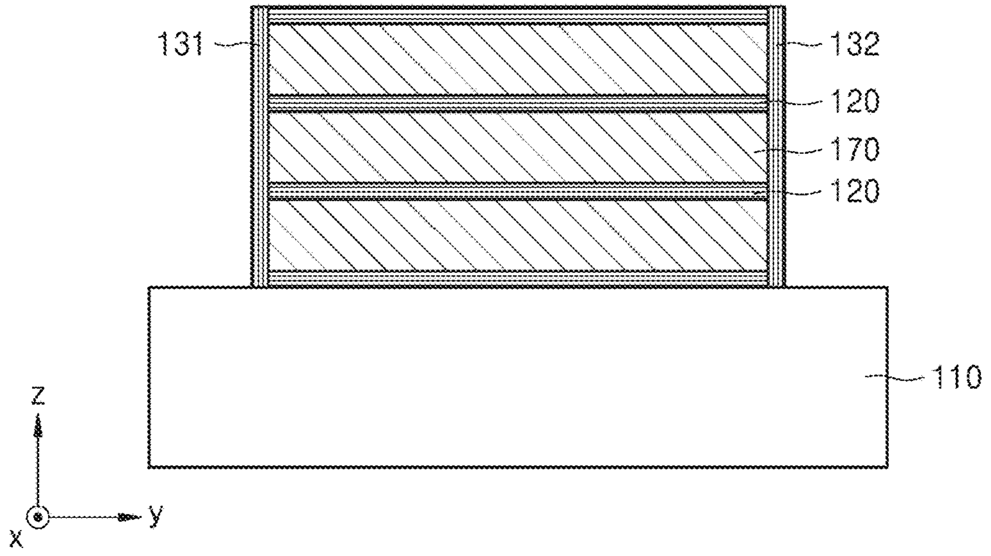
Figure 5C:
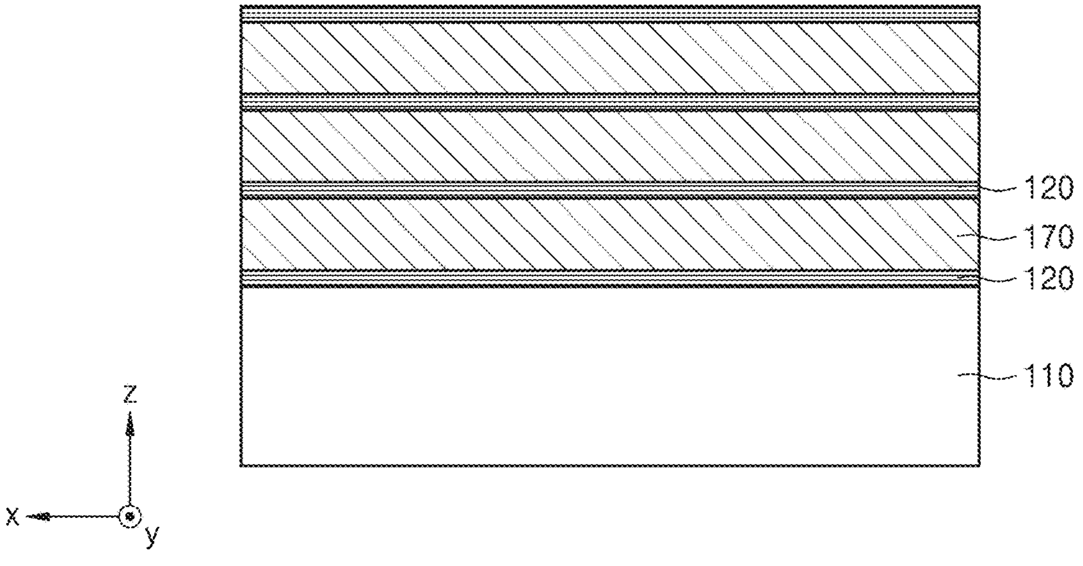

Referring to FIGS. 5A to 5C, both lateral portions of the stacked structure shown in FIG. 4A are etched in a first direction (for example, a y-axis direction), and then second two-dimensional material layers 131 and 132 are respectively deposited on both sides of the etched stacked structure. Therefore, each of the second two-dimensional material layers 131 and 132 may be formed in a direction substantially perpendicular to the first two-dimensional material layers 120.

For example, an etching mask (not shown) is formed using a photoresist on an upper surface of the stacked structure shown in FIG. 4A, and then both lateral portions of the stacked structure, which are exposed through the etching mask, are removed by etching. Next, the second two-dimensional material layers 131 and 132 are respectively deposited on both sides of the stacked structure.

The second two-dimensional material layers 131 and 132 may be deposited by, for example, CVD or ALD. In this deposition process, the second two-dimensional material layers 131 and 132 may be grown through edge epitaxy respectively on end portions of each of the first two-dimensional material layers 120. FIGS. 5A and 5B illustrate an example in which each of the second two-dimensional material layers 131 and 132 is formed in one piece. However, growth conditions may be adjusted such that each of the second two-dimensional material layers 131 and 132 may include a plurality of material layers that are apart from each other as shown in FIG. 3.

The second two-dimensional material layers 131 and 132 may include a two-dimensional material having semiconductor characteristics, metallic characteristics, or semi-metallic characteristics. For example, the second two-dimensional material layers 131 and 132 may include a TMD or black phosphorus. For example, the second two-dimensional material layers 131 and 132 may include graphene, antimony, or the like. The second two-dimensional material layers 131 and 132 may include the same material as that included in the first two-dimensional material layers 120. However, embodiments are not limited thereto, and the second two-dimensional material layers 131 and 132 may include a material different from that included in the first two-dimensional material layers 120. In addition, the second two-dimensional material layers 131 and 132 may be doped with a dopant.

Each of the second two-dimensional material layers 131 and 132 may have a monolayer or multilayer structure in which each layer has an atomic level thickness. Each of the second two-dimensional material layers 131 and 132 may include, for example, one to ten layers. For example, each of the second two-dimensional material layers 131 and 132 may include one to five layers. However, embodiments are not limited thereto. The number of layers included in each of the second two-dimensional material layers 131 and 132 may be equal to or greater than the number of layers included in each of the first two-dimensional material layers 120.

Figure 6A:
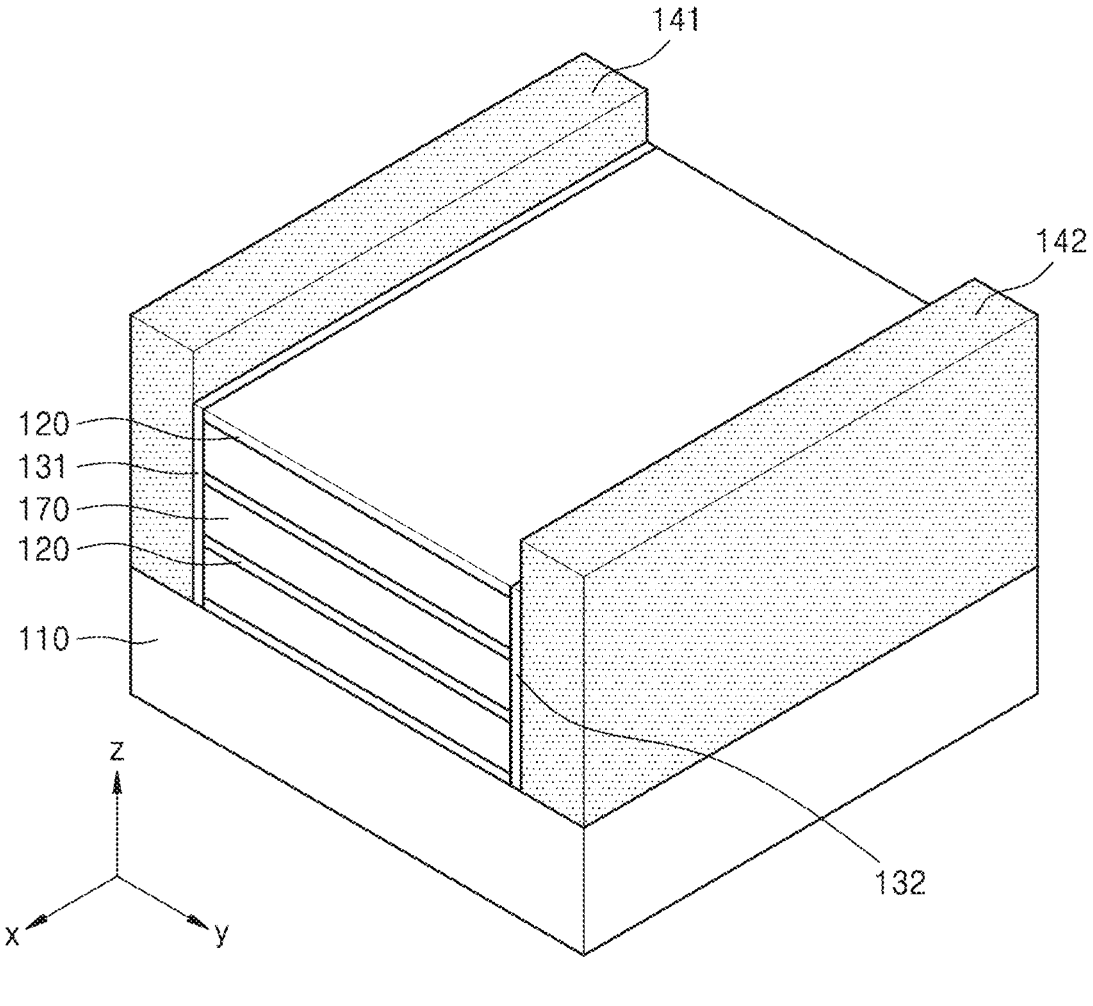
Figure 6B:
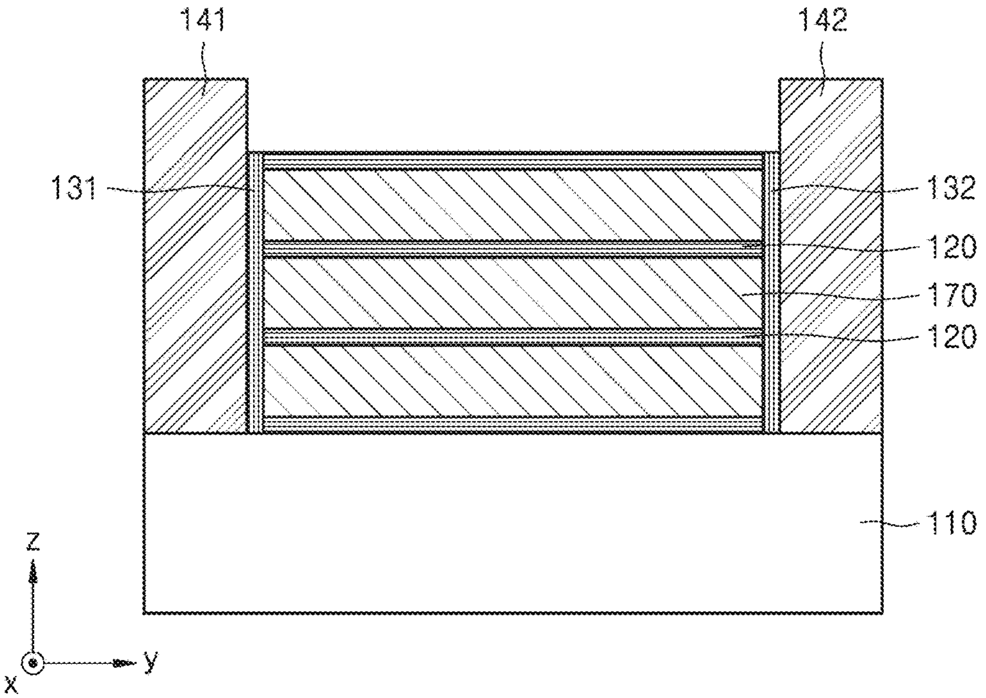
Figure 6C:
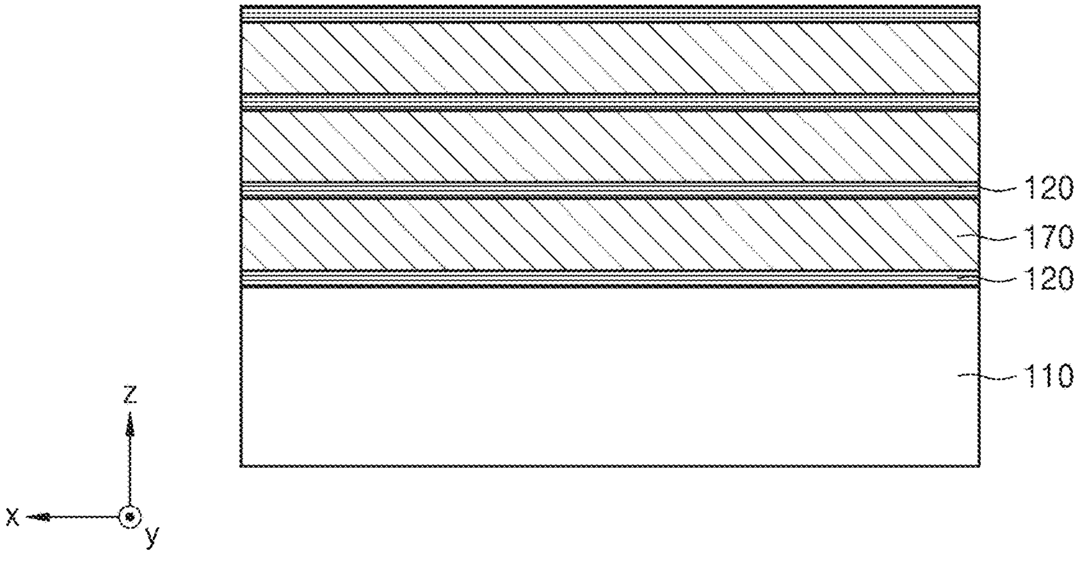

Referring to FIGS. 6A to 6C, a source electrode 141 and a drain electrode 142 are respectively formed on both sides of the stacked structure of the first two-dimensional material layers 120 and the sacrificial layers 170. The source electrode 141 may be deposited on the second two-dimensional material layer 131 provided on one side of the stacked structure, and the drain electrode 142 may be deposited on the second two-dimensional material layer 132 provided on the other side of the stacked structure. Here, the second two-dimensional material layers 131 and 132 may be respectively in planar contact with the source and drain electrodes 141 and 142. The source electrode 141 and the drain electrode 142 may include, for example, a metal material having high electrical conductivity, such as Ag, Au, Pt, or Cu, but are not limited thereto.

Figure 7A:
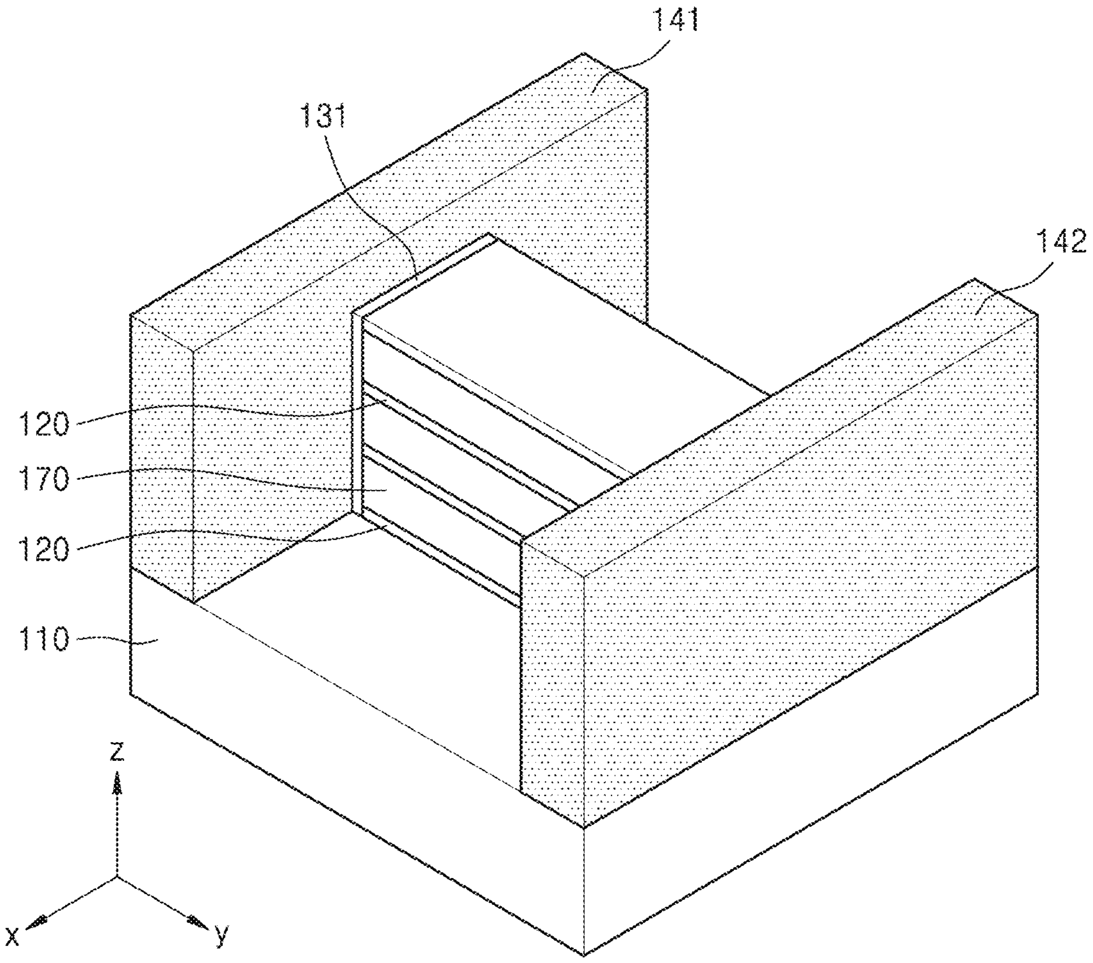
Figure 7B:
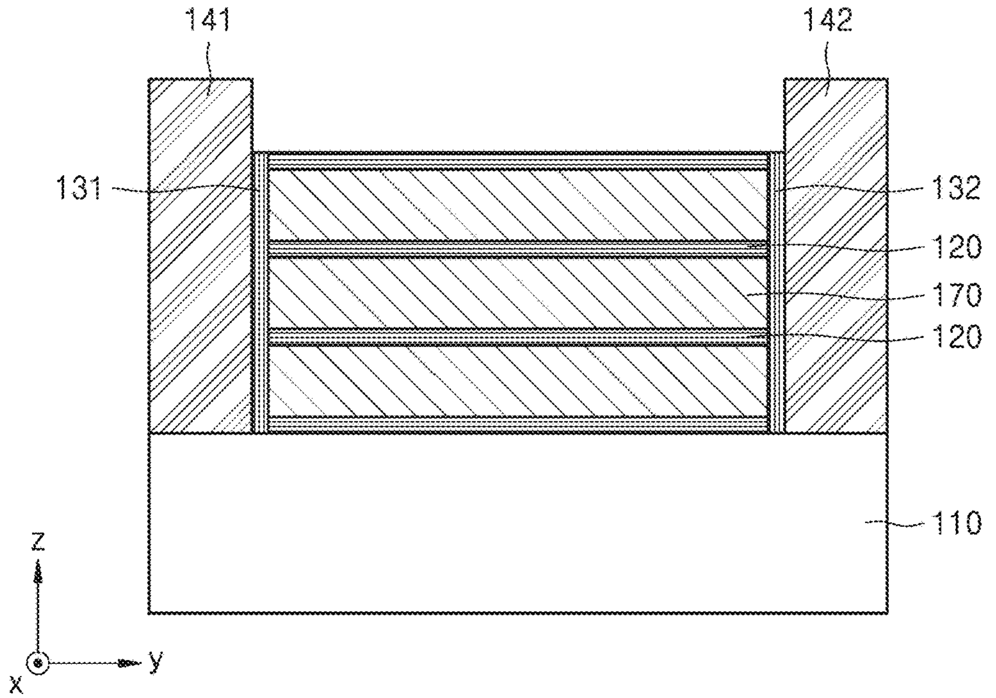
Figure 7C:
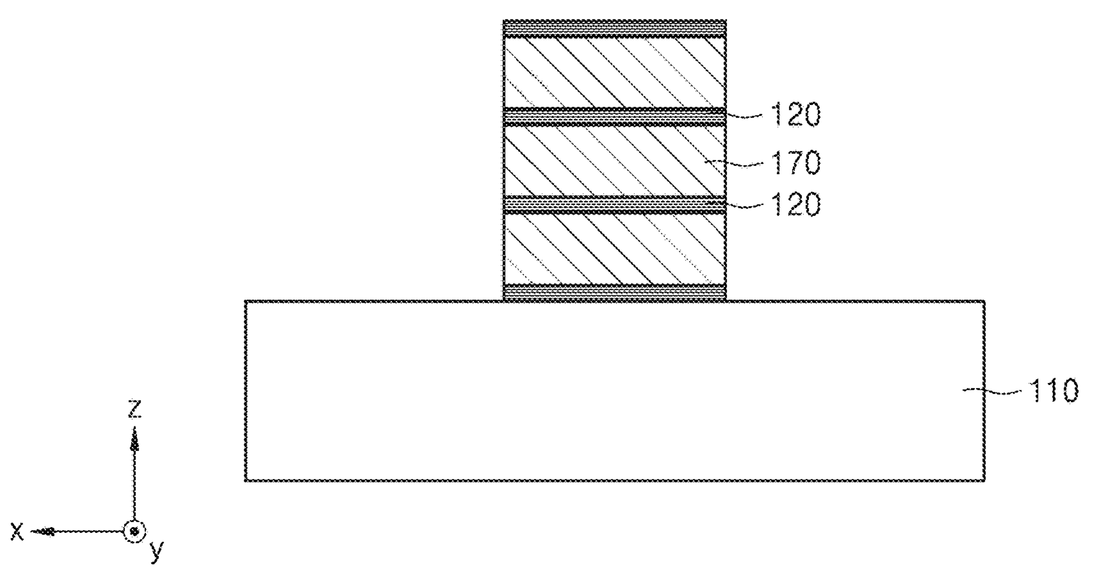
Figure 8A:
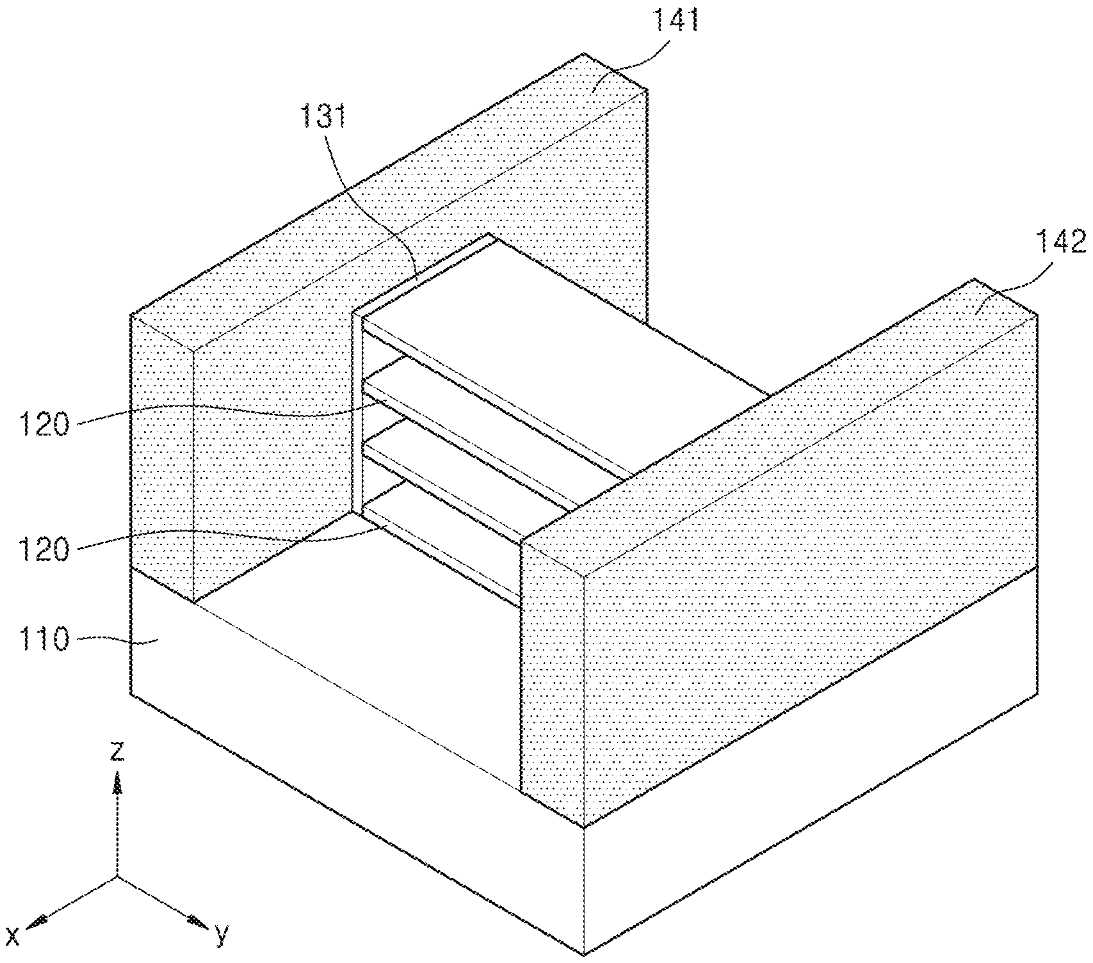
Figure 8B:
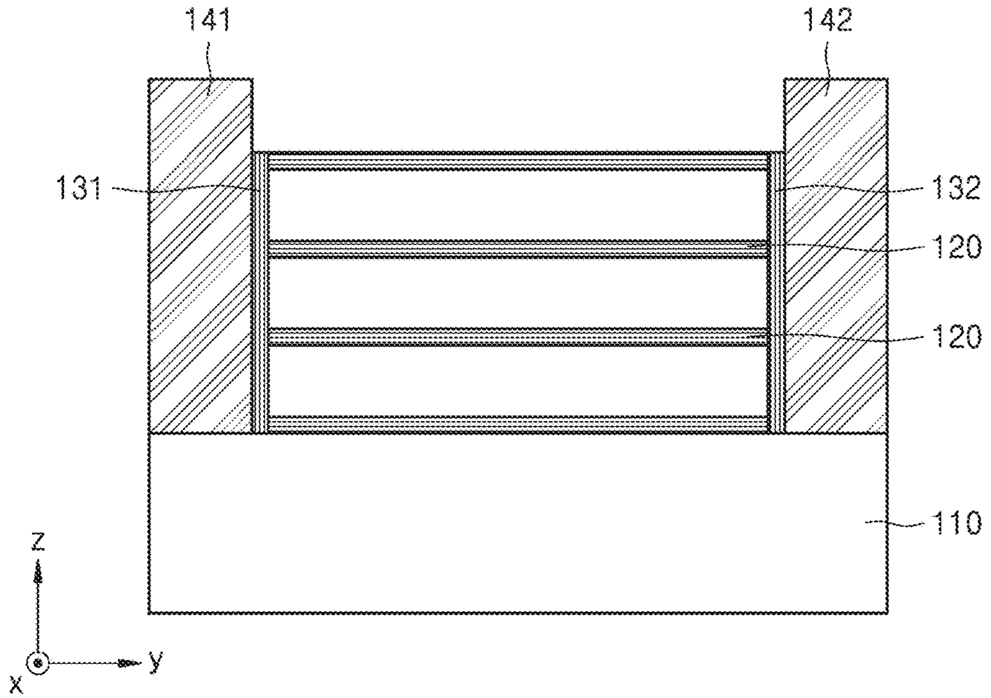
Figure 8C:
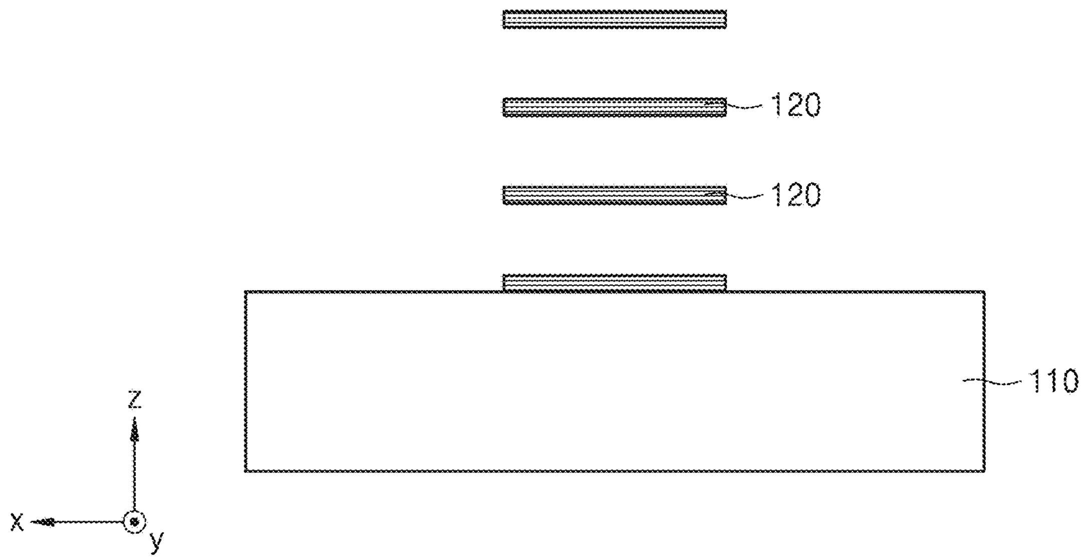

Referring to FIGS. 7A to 7C, both sides of the stacked structure of the first two-dimensional material layers 120 and the sacrificial layers 170 are etched in a second direction (for example, an x-axis direction) perpendicular to the first direction. Referring to FIGS. 8A to 8C, the sacrificial layers 170 provided between the first two-dimensional material layers 120 are removed. Surfaces of the first two-dimensional material layers 120 may be exposed owing to the removal of the sacrificial layers 170.

Figure 9A:
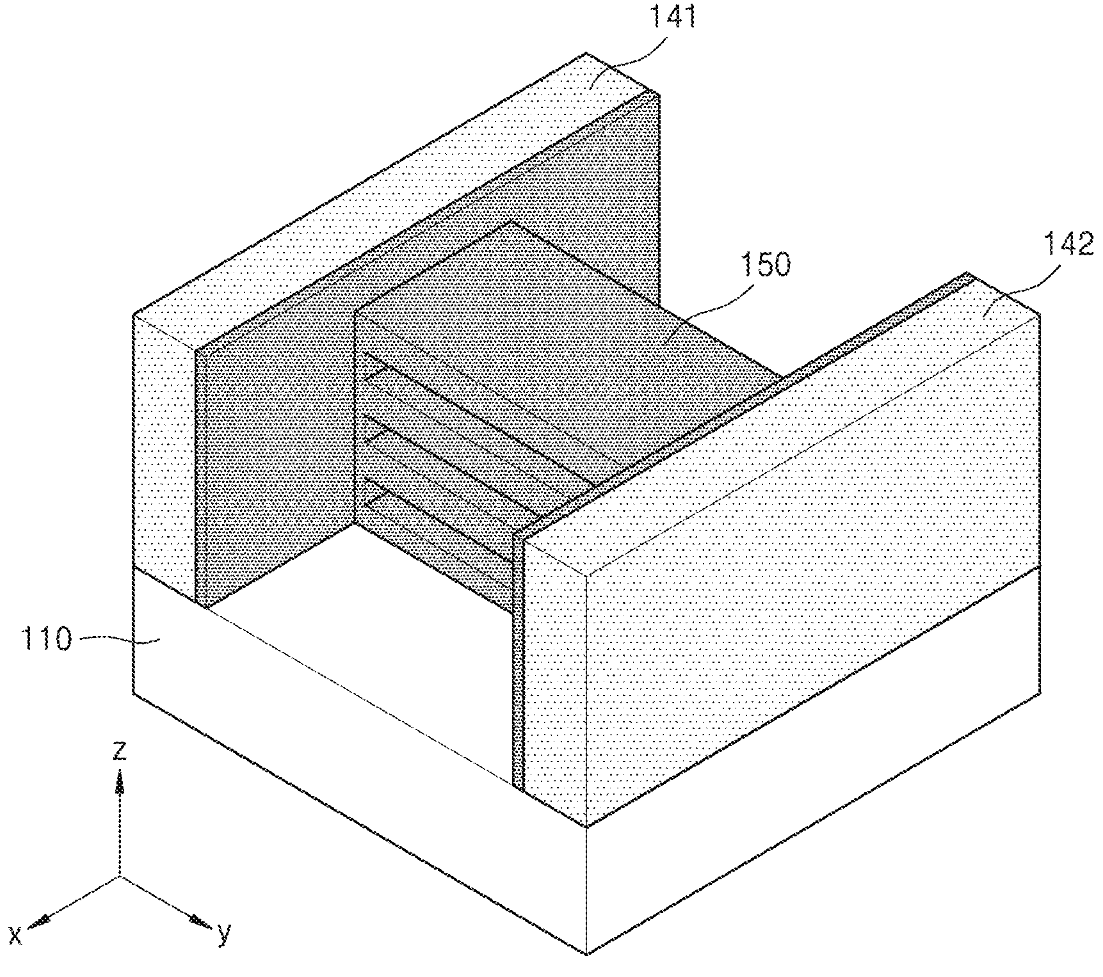
Figure 9B:
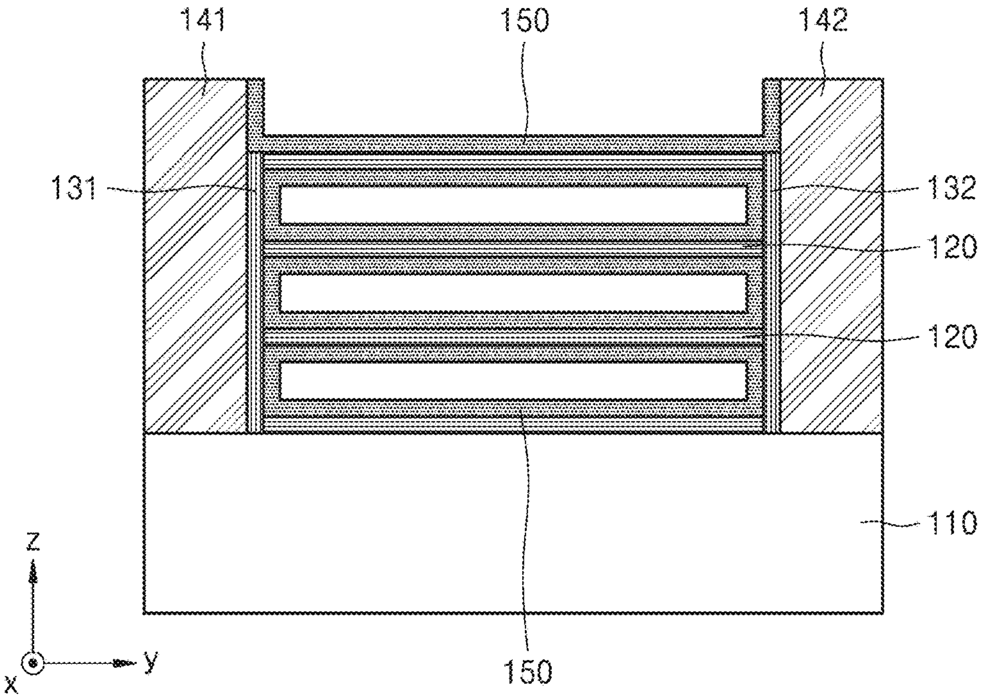
Figure 9C:
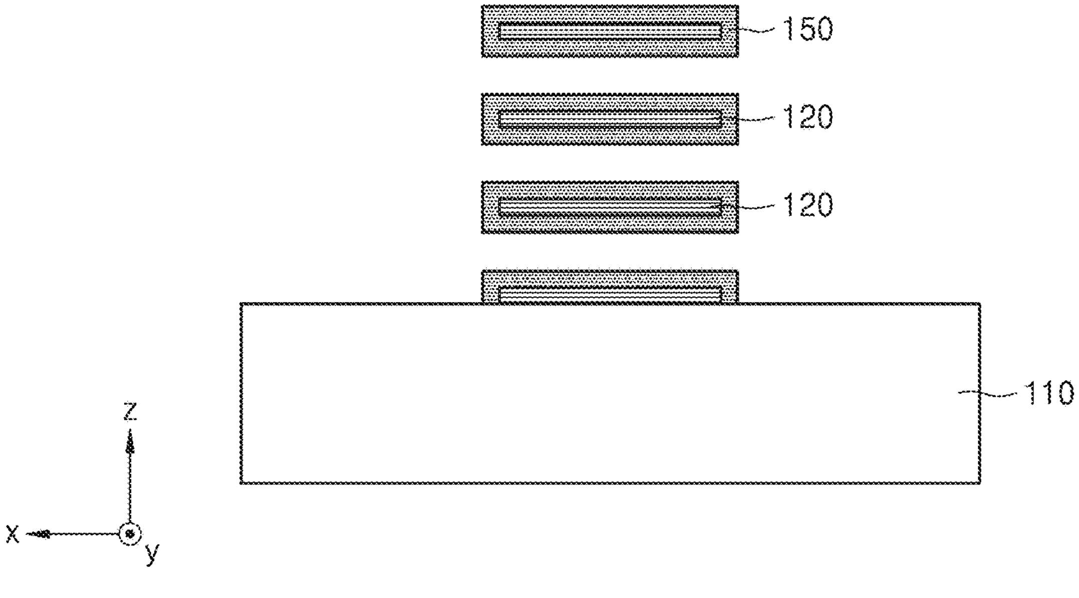

Referring to FIGS. 9A to 9C, a gate insulating layer 150 is deposited to cover the exposed surfaces of the first two-dimensional material layers 120. The gate insulating layer 150 may surround the first two-dimensional material layers 120. The gate insulating layer 150 may include, for example, silicon nitride, but is not limited thereto.

Figure 10A:
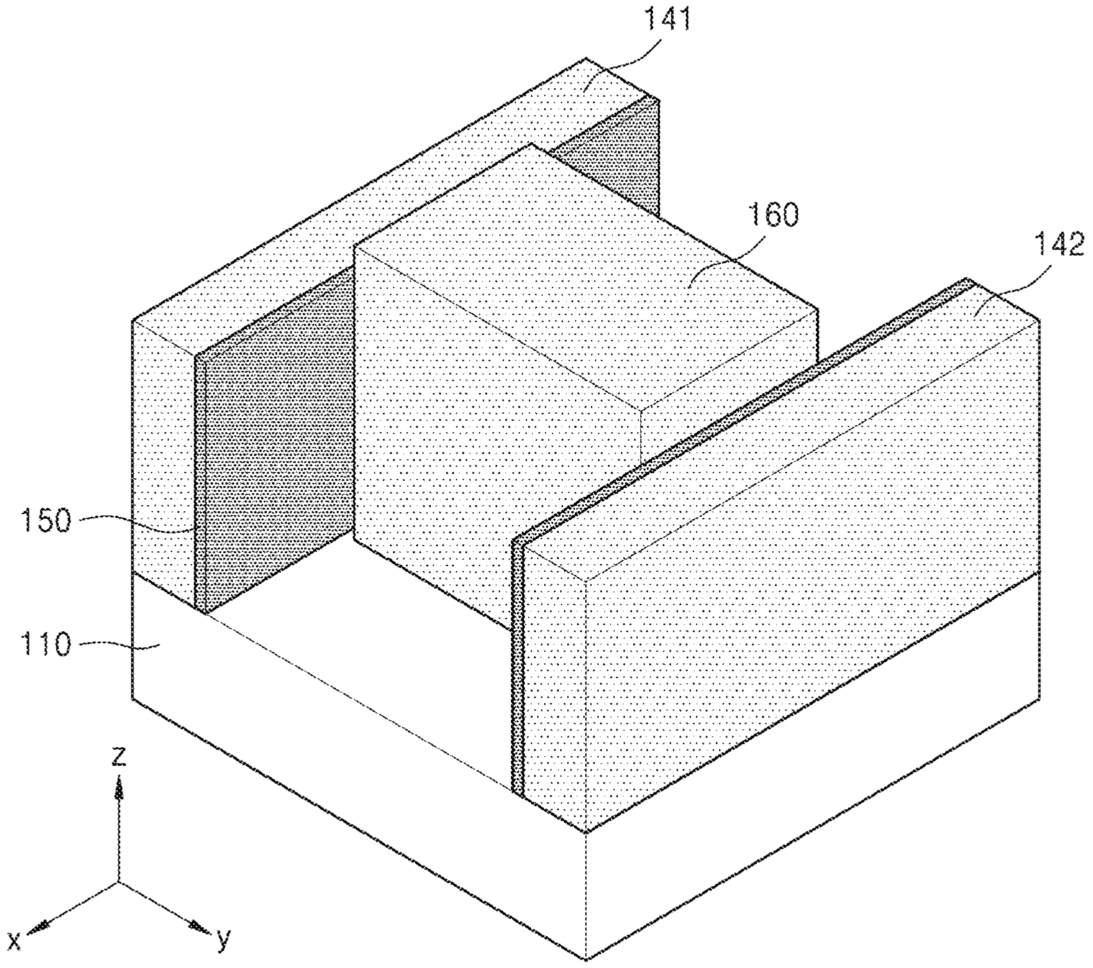
Figure 10B:
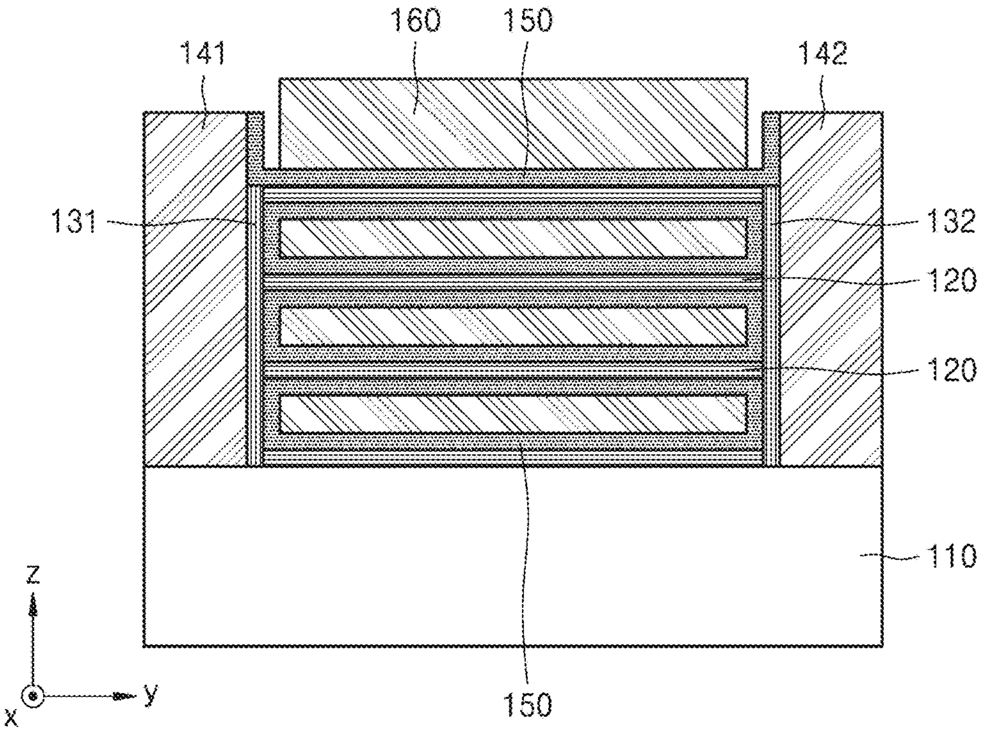
Figure 10C:
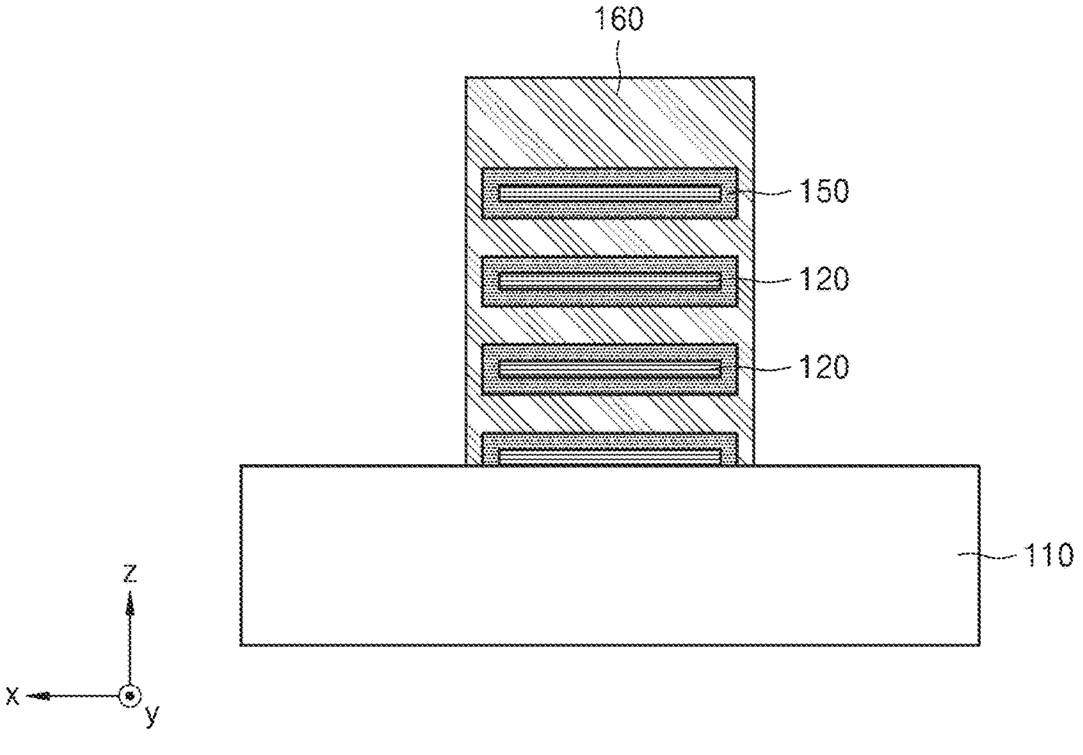

Referring to FIGS. 10A to 10C, a gate electrode 160 is deposited on the gate insulating layer 150. The gate electrode 160 may surround the first two-dimensional material layers 120 which form a channel layer between the source electrode 141 and the drain electrode 142. The gate electrode 160 may include a metal material or a conductive oxide. Here, the metal material may include, for example, at least one selected from the group consisting of Au, Ti, TiN, TaN, W, Mo, WN, Pt, and Ni. In addition, the conductive oxide may include, for example, ITO, IZO, or the like. However, the listed materials are merely examples.

The semiconductor devices 100 and 200 described above may be applied to, for example, memory devices such as a DRAM device. The memory devices may have a structure in which the semiconductor device 100 or 200 described above is electrically connected to a capacitor. In addition, the semiconductor devices 100 and 200 may be applied to various electronic apparatuses. For example, the semiconductor devices 100 and 200 may be used for arithmetic operations, program execution, temporary data retention, or the like in electronic apparatuses such as mobile devices, computers, laptop computers, sensors, network devices, or neuromorphic devices.

Figure 11:
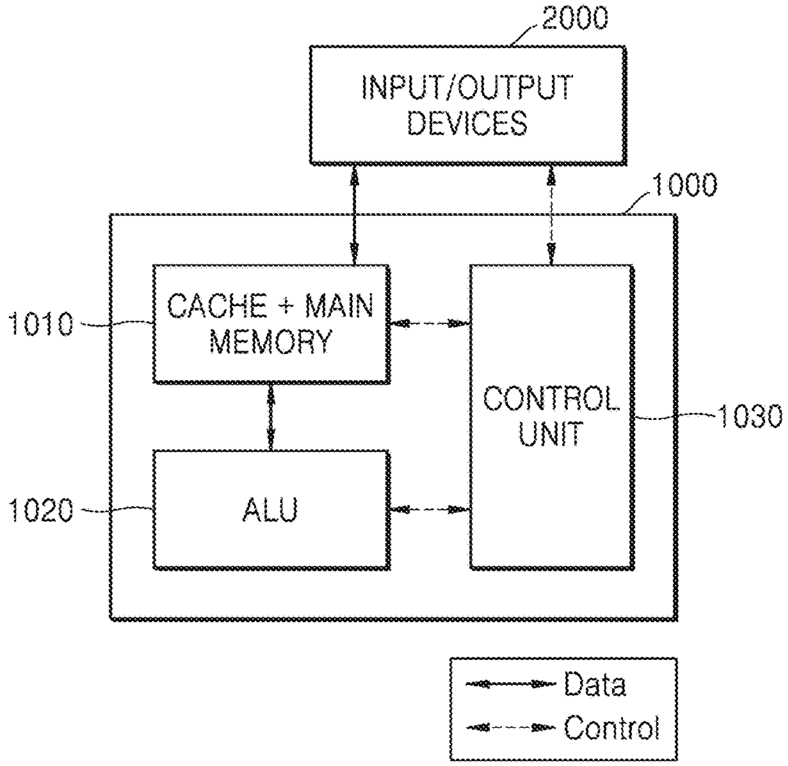
FIGS. 11 and 12 are conceptual views schematically illustrating device architectures applicable to electronic apparatuses according to example embodiments.
Figure 12:
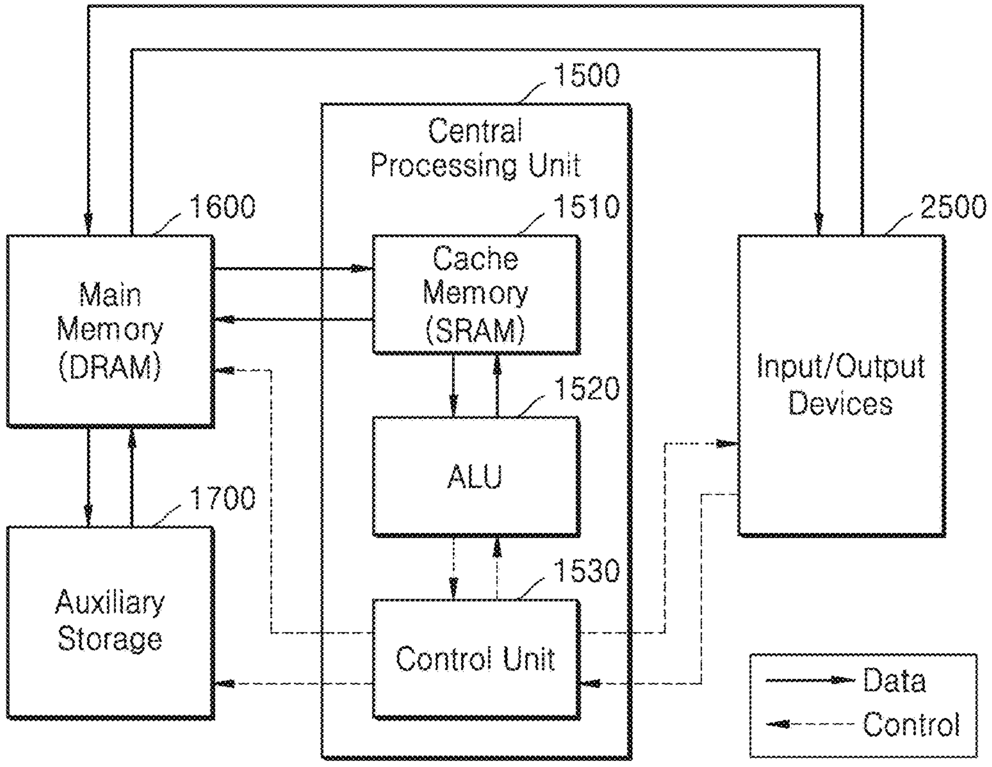

FIGS. 11 and 12 are conceptual views schematically illustrating electronic device architectures applicable to electronic apparatuses according to example embodiments.

Referring to FIG. 11, an electronic device architecture 1000 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1000 may be implemented as one chip including the memory unit 1010, the ALU 1020, and the control unit 1030.

For example, the memory unit 1010, the ALU 1020, and the control unit 1030 may be interconnected with each other on a chip through metal lines for direct communication with each other. The memory unit 1010, the ALU 1020, and the control unit 1030 may be monolithically integrated on a single substrate to form a single chip. Input/output devices 2000 may be connected to the electronic device architecture (chip) 1000.

The ALU 1020 and the control unit 1030 may each independently include the semiconductor devices 100 and 200 described above; and the memory unit 1010 may include the semiconductor devices 100 and 200 described above, capacitors, or combinations thereof. The memory unit 1010 may include both a main memory and a cache memory. The electronic device architecture (chip) 1000 may be an on-chip memory processing unit.

Referring to FIG. 12, a cache memory 1510, an ALU 1520, and a control unit 1530 may form a central processing unit (CPU) 1500. The cache memory 1510 may include a static random access memory (SRAM) including the semiconductor devices 100 and 200 described above. A main memory 1600 and an auxiliary storage 1700 may be provided separately from the CPU 1500. The main memory 1600 may include a dynamic random access memory (DRAM) device.

In some cases, the electronic device architectures may be implemented in the form in which unit computing devices and unit memory devices are adjacent to each other on one chip without any distinction between sub-units.

Figure 13:
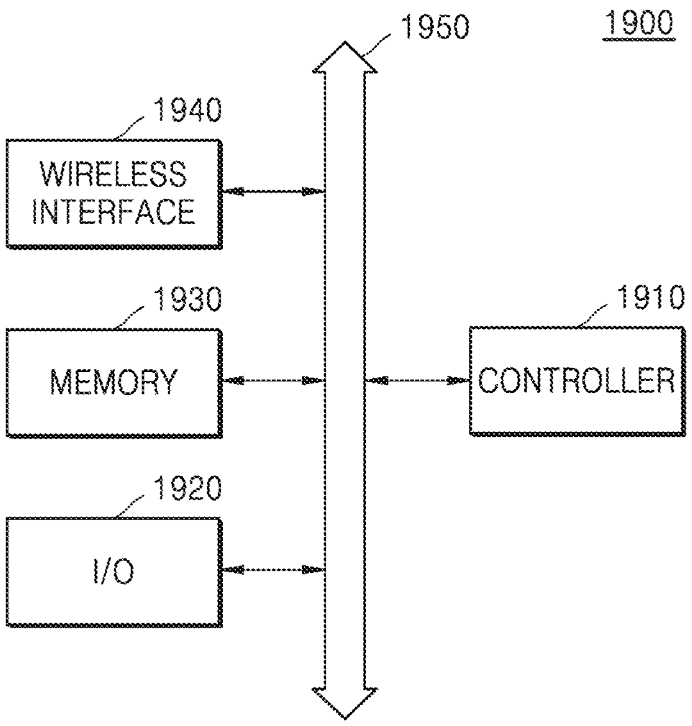
FIG. 13 is a block diagram of an electronic apparatus according to an embodiment.

FIG. 13 is a block diagram of an electronic apparatus according to an embodiment.

The electronic apparatus 1900 may constitute a wireless communication device or a device capable of transmitting and/or receiving information in a wireless environment. The electronic apparatus 1900 may include a controller 1910, an input/output device (I/O) 1920, a memory 1930, and a wireless interface 1940, and these components may be interconnected to each other through a bus 1950.

The controller 1910 may include at least one of a microprocessor, a digital signal processor, or a processing device similar thereto. The input/output device 1920 may include at least one of a keypad, a keyboard, and a display. The memory 1930 may be used to store instructions executed by controller 1910. For example, the memory 1930 may be used to store user data. The electronic apparatus 1900 may use the wireless interface 1940 to transmit/receive data through a wireless communication network. The wireless interface 1940 may include an antenna and/or a wireless transceiver. In some embodiments, the electronic system 4200 may be used in a communication interface protocol of a variety of communication systems, for example, code division multiple access (CDMA), global system for mobile communications (GSM), north American digital cellular (NADC), extended-time division multiple access (E-TDMA), and/or wide band code division multiple access (WCDMA). The electronic apparatus 1900 may include the semiconductor devices 100 and 200 described above in the controller 1910, memory 1930, or other portions.

Figure 14:
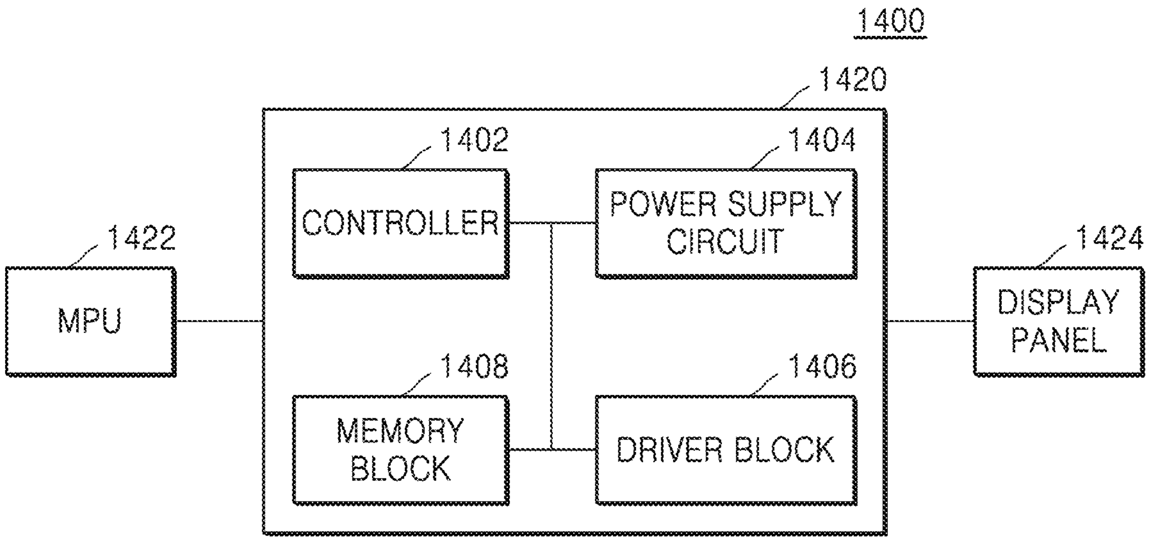
FIG. 14 is a schematic block diagram of a display apparatus according to an embodiment.

FIG. 14 of a display apparatus according to an embodiment.

Referring to FIG. 14, the display apparatus 1400 may include a display driver IC (DDI) 1420 including a controller 1402, a power supply circuit 1404, a driver block 1406, and a memory block 1408. The controller 1402 receives and decodes a command applied from a main processing unit (MPU) 1422, and controls each block of the DDI 1420 to implement an operation according to the command. The power supply circuit unit 1404 generates a driving voltage in response to the control of the control unit 1402. The driver block 1406 drives a display panel 1424 using the driving voltage generated by the power supply circuit unit 1404 in response to the control of the controller 1402. The display panel 1424 may be a liquid crystal display panel or a plasma display panel. The memory block 1408 is a block for temporarily storing commands input to the controller 1402 or control signals output from the controller 1402, or for storing necessary data, and may include a memory, such as RAM or ROM. The power supply circuit unit 1404 and the driver block 1406 may include the electronic device according to the embodiment described above. The display apparatus 1400 may include the semiconductor devices 100 and 200 described above in the controller 1402, memory block 1408, driver block 1406, MPU 1422, or other portions.

As described above, in the semiconductor devices 100 and 200 of the above example embodiments, the second two-dimensional material layers 131 and 132 or the second two-dimensional material layers 231 and 232 electrically connected to the at least one first two-dimensional material layer 120 or 220 forming a channel layer are in planar contact with the source and drain electrodes 141 and 142, thereby reducing the contact resistance therebetween. In addition, the second two-dimensional material layers 131 and 132 or the second two-dimensional material layers 231 and 232 are grown through edge epitaxy on end portions of the at least one first two-dimensional material layer 120 or 220, thereby reducing the contact resistance between the second two-dimensional material layers 131 and 132 or 231 and 232 and the at least one first two-dimensional material layer 120 or 220. While embodiments have been described, the embodiments are merely examples, and it will be understood by those of ordinary skill in the art that various modifications may be made in the embodiments.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:

at least one first two-dimensional material layer;

a source electrode and a drain electrode that are respectively on both sides of the at least one first two-dimensional material layer;

second two-dimensional material layers respectively on a side of the source electrode and a side of the drain electrode and connected to the at least one first two-dimensional material layer;

a gate insulating layer surrounding the at least one first two-dimensional material layer; and a gate electrode on the gate insulating layer, wherein a number of layers in the second two-dimensional material layers is different from a number of layers in the at least one first two-dimensional material layer.

2. The semiconductor device of claim 1, wherein the second two-dimensional material layers extend in a direction substantially perpendicular to the at least one first two-dimensional material layer.

3. The semiconductor device of claim 2, wherein the second two-dimensional material layers are in planar contact with the source electrode and the drain electrode.

4. The semiconductor device of claim 1, wherein the at least one first two-dimensional material layer comprises a plurality of first two-dimensional material layers, the plurality of first two-dimensional material layers extend in a direction substantially perpendicular to the second two-dimensional material layers, and the plurality of first two-dimensional material layers are spaced apart from each other.

5. The semiconductor device of claim 4, wherein all or some of the plurality of first two-dimensional material layers are connected to the second two-dimensional material layers.

6. The semiconductor device of claim 1, wherein the number of layers in the second two-dimensional material layers is greater than the number of layers in the at least one first two-dimensional material layer.

7. An electronic apparatus comprising:

the semiconductor device of claim 1.

8. A method of fabricating a semiconductor device, the method comprising:

alternately stacking at least one first sacrificial layer and at least one first two-dimensional material layer on a substrate;

etching a first side and a second side of the at least one first two-dimensional material layer and the at least one first sacrificial layer in a first direction to provide a first etched side and a second etched side of the at least one first two-dimensional material layer and the at least one first sacrificial layer;

forming second two-dimensional material layers respectively on both the first etched side and the second etched side of the at least one first two-dimensional material layer and the at least one first sacrificial layer;

forming a source electrode and a drain electrode respectively on the first etched side and the second etched side of the at least one first two-dimensional material layer and the at least one first sacrificial layer such that the source electrode and the drain electrode are in contact with the second two-dimensional material layers;

removing the at least one first sacrificial layer and then forming a gate insulating layer that surrounds the at least one first two-dimensional material layer; and forming a gate electrode on the gate insulating layer, wherein a number of layers in the second two-dimensional material layers is different from a number of layers in the at least one first two-dimensional material layer.

9. The method of claim 8, further comprising:

etching, in a second direction perpendicular to the first direction, a third side and a fourth side of the at least one first two-dimensional material layer and the at least one first sacrificial layer after the etching the first side and the second side of the at least one first two-dimensional material layer and the at least one first sacrificial layer in the first direction is performed.

10. The method of claim 8, wherein the forming the second two-dimensional material layers includes growing the second two-dimensional material layers on edge portions of the at least one first two-dimensional material layer in a direction substantially perpendicular to the at least one first two-dimensional material layer.

11. The method of claim 8, wherein the at least one first two-dimensional material layer comprises a plurality of first two-dimensional material layers, and the forming the second two-dimensional material layers includes forming the second two-dimensional material layers connected to all or some of the plurality of first two-dimensional material layers.

12. The method of claim 8, wherein the second two-dimensional material layers are in planar contact with the source electrode and the drain electrode.

13. The method of claim 8, wherein the at least one first two-dimensional material layer comprises a two-dimensional material having semiconductor characteristics.

14. The method of claim 8, wherein the second two-dimensional material layers comprise a two-dimensional material having semiconductor characteristics, metallic characteristics, or semi-metallic characteristics.

15. The method of claim 8, wherein the number of layers in the second two-dimensional material layers is greater than the number of layers in the at least one first two-dimensional material layer.

16. A semiconductor device comprising:

at least one first two-dimensional material layer;

a source electrode and a drain electrode that are respectively on both sides of the at least one first two-dimensional material layer;

second two-dimensional material layers respectively on a side of the source electrode and a side of the drain electrode and connected to the at least one first two-dimensional material layer;

a gate insulating layer surrounding the at least one first two-dimensional material layer; and a gate electrode on the gate insulating layer, wherein the at least one first two-dimensional material layer has an electrical property different from the second two-dimensional material layers.

17. The semiconductor device of claim 16, wherein the at least one first two-dimensional material layer and the second two-dimensional material layers comprise a transition metal dichalcogenide (TMD), and at least one of the at least one first two-dimensional material layer and the second two-dimensional material layers comprises a dopant.

18. The semiconductor device of claim 17, wherein the second two-dimensional material layers comprise the dopant, and the at least one first two-dimensional material layer does not comprise the dopant.

19. The semiconductor device of claim 16, wherein, the at least one first two-dimensional material layer comprises a material different from a material of the second two-dimensional material layers.

20. The semiconductor device of claim 19, wherein the at least one first two-dimensional material layer comprises at least one of Mo, W, Nb, V, Ta, Ti, Zr, Hf, Co, Tc and Re, and at least one of S, Se and Te, and the second two-dimensional material layers comprise at least one of Mo, W, Nb, V, Ta, Ti, Zr, Hf, Co, Tc and Re, and at least one of S, Se and Te.

* * * * *